(12) United States Patent
Kim et al.

(10) Patent No.: US 7,482,224 B2
(45) Date of Patent: Jan. 27, 2009

(54) METHODS OF FABRICATING SEMICONDUCTOR INTEGRATED CIRCUIT DEVICES INCLUDING SRAM CELLS AND FLASH MEMORY CELLS

(75) Inventors: Gyeong-Hee Kim, Gyeonggi-do (KR); Jun-Eui Song, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 107 days.

(21) Appl. No.: 11/301,763

(22) Filed: Dec. 13, 2005

(65) Prior Publication Data
US 2006/0138463 A1    Jun. 29, 2006

(30) Foreign Application Priority Data
Dec. 28, 2004    (KR) ...................... 10-2004-0114333

(51) Int. Cl.
*H01L 21/336*    (2006.01)
(52) U.S. Cl. ................ 438/257; 438/593; 257/E29.129
(58) Field of Classification Search ................ 438/201, 438/142, 197, 199, 200, 257, 211, 258, 593; 257/E29.129
See application file for complete search history.

(56) References Cited

U.S. PATENT DOCUMENTS

| | | | |
|---|---|---|---|
| 5,605,853 A | | 2/1997 | Yoo et al. |
| 5,889,305 A | * | 3/1999 | Choi et al. ................... 257/324 |
| 6,376,316 B2 | * | 4/2002 | Shukuri et al. .............. 438/275 |
| 6,406,959 B2 | | 6/2002 | Prall et al. |
| 2003/0107064 A1 | * | 6/2003 | Yasuda ........................ 257/288 |

FOREIGN PATENT DOCUMENTS

| | | |
|---|---|---|
| JP | 08-306888 | 11/1996 |
| KR | 10-2001-0048210 | 6/2001 |

OTHER PUBLICATIONS

Office Action for Korean Patent Application No. 10-2004-0114333 dated Apr. 19, 2006.
English translation of Korean Office Action for Patent Application No. 10-2004-0114333 dated Apr. 19, 2006 (Korean Office Action was originally submitted Jun. 5, 2006).

* cited by examiner

*Primary Examiner*—Khiem D Nguyen
(74) *Attorney, Agent, or Firm*—Myers Bigel Sibley & Sajovec, P.A.

(57) ABSTRACT

Semiconductor integrated circuit devices having SRAM cells and flash memory cells are provided. The devices include an integrated circuit substrate having an SRAM cell region, a flash memory cell region and a logic circuit region. An isolation layer is provided in a predetermined region of the substrate. The isolation layer defines a SRAM cell active region, a flash memory cell active region and a logic transistor active region in the SRAM cell region, the flash memory cell region and the logic circuit region, respectively. An SRAM cell gate pattern crosses over the SRAM cell active region. The SRAM cell gate pattern includes a main gate electrode and a dummy gate electrode which are sequentially stacked. A flash memory cell gate pattern crosses over the flash memory cell active region. The flash memory cell gate pattern includes a control gate electrode crossing over the flash memory cell active region as well as a floating gate interposed between the control gate electrode and the flash memory cell active region. A logic gate pattern crosses over the logic transistor active region. The logic gate pattern also includes a main gate electrode and a dummy gate electrode which are sequentially stacked. Related methods of fabricating semiconductor integrated circuit devices are also provided.

19 Claims, 30 Drawing Sheets

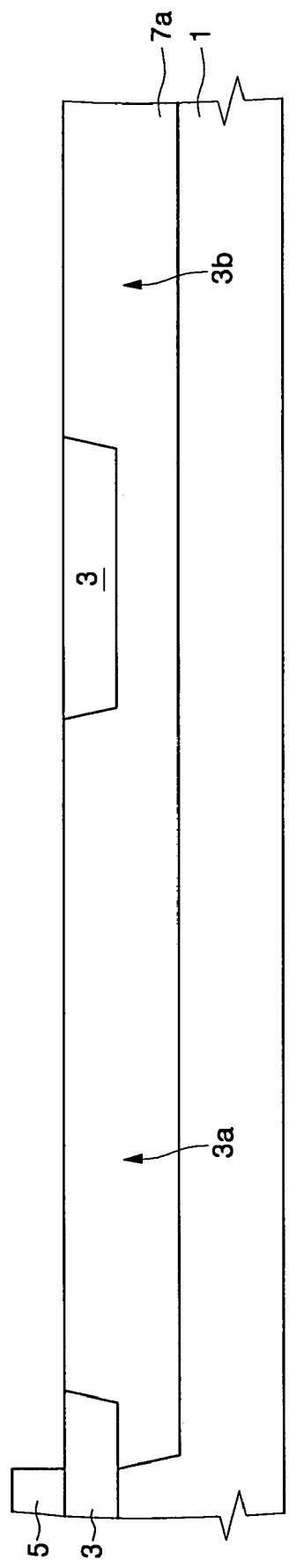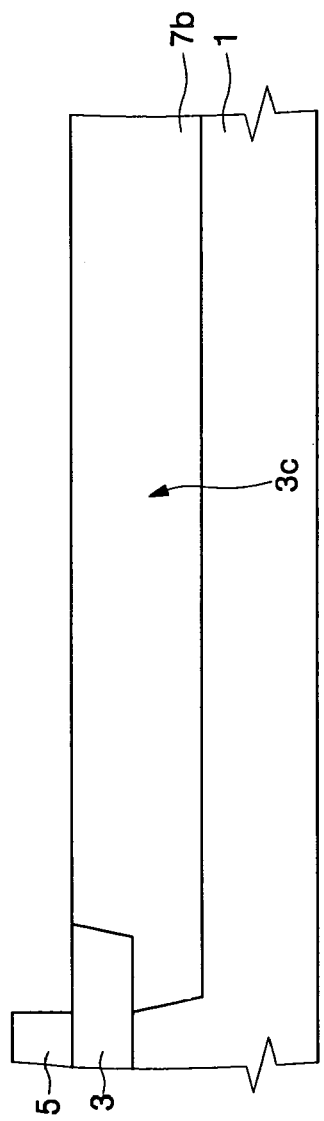

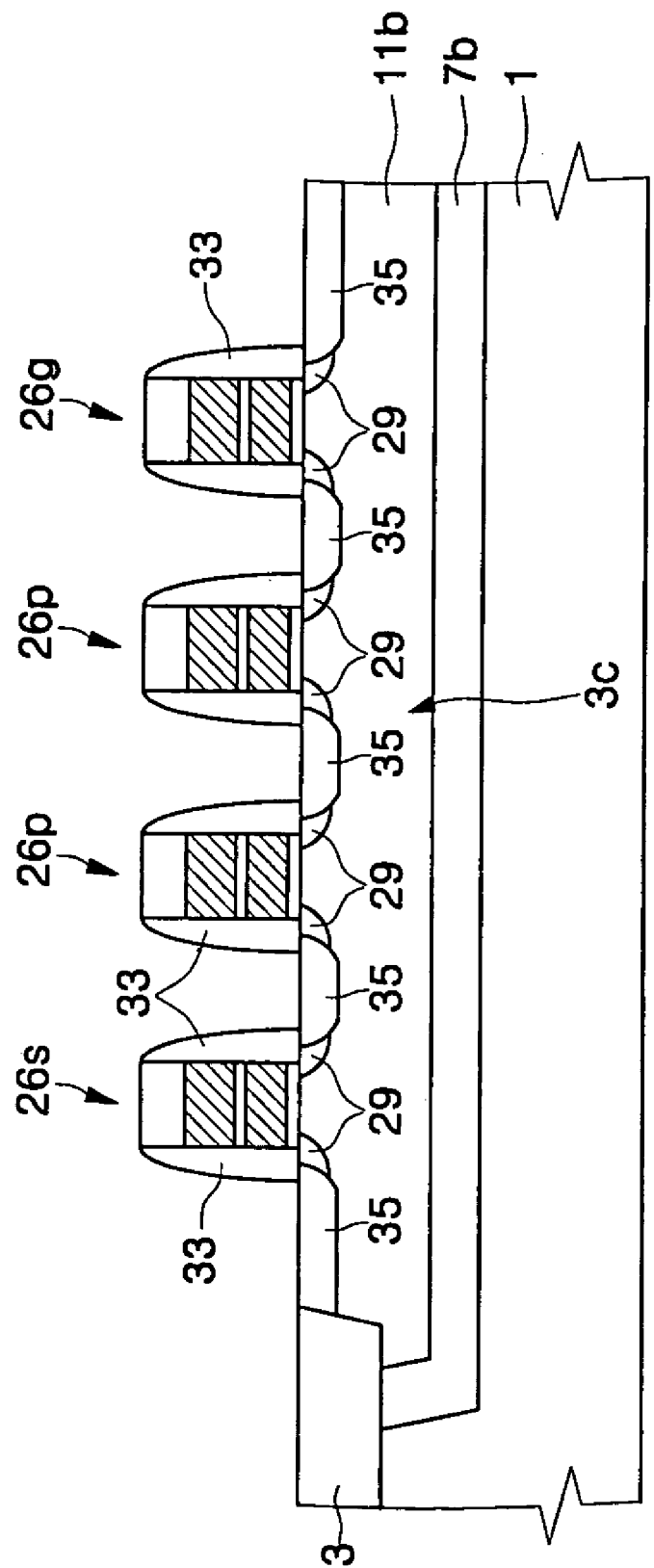

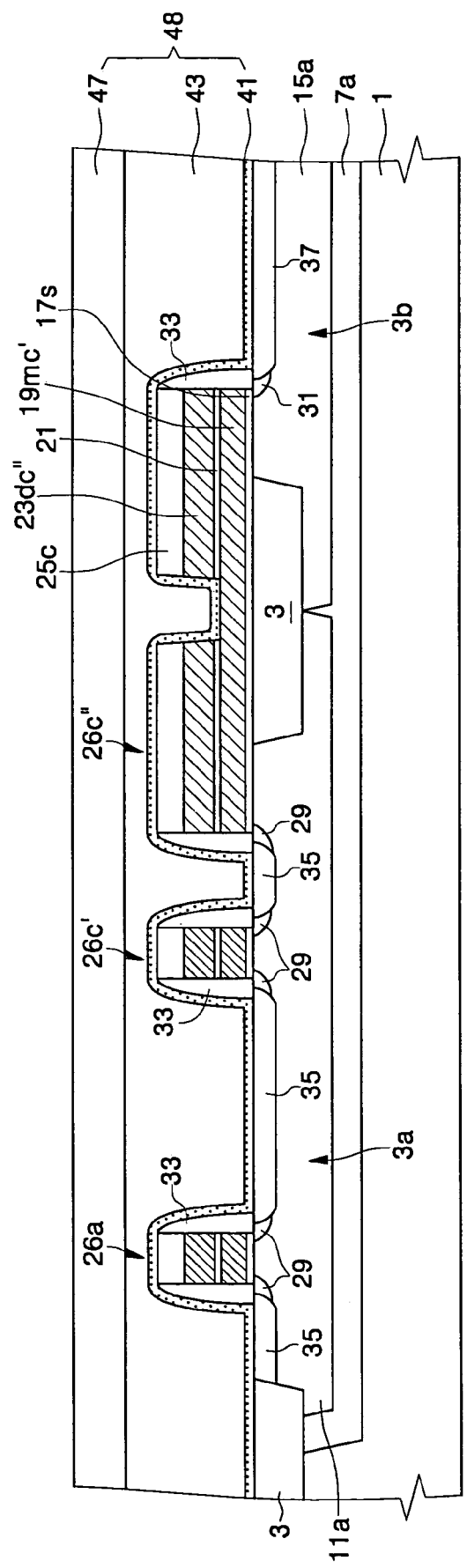

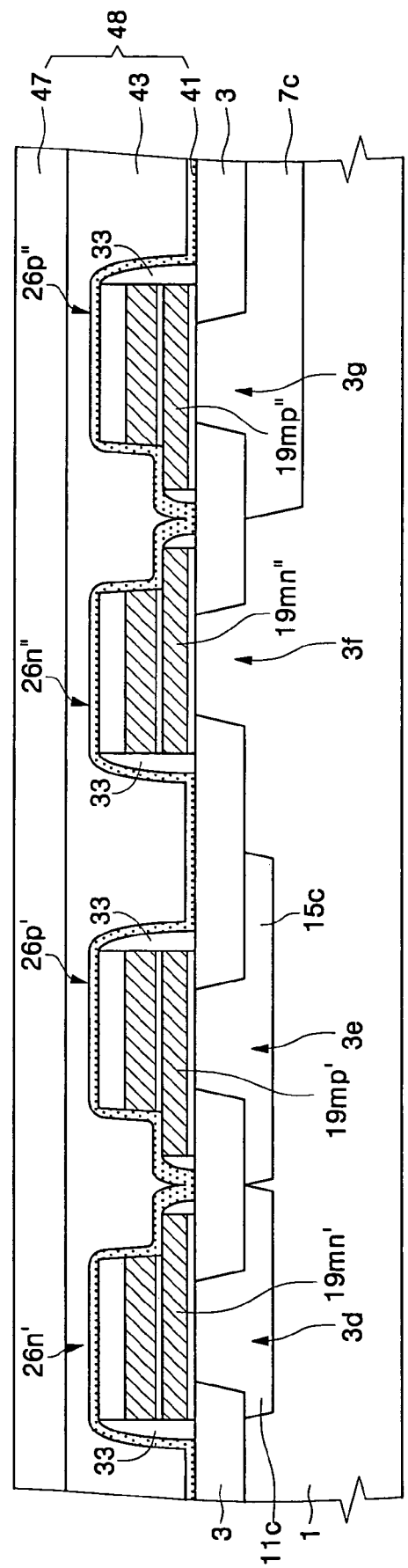

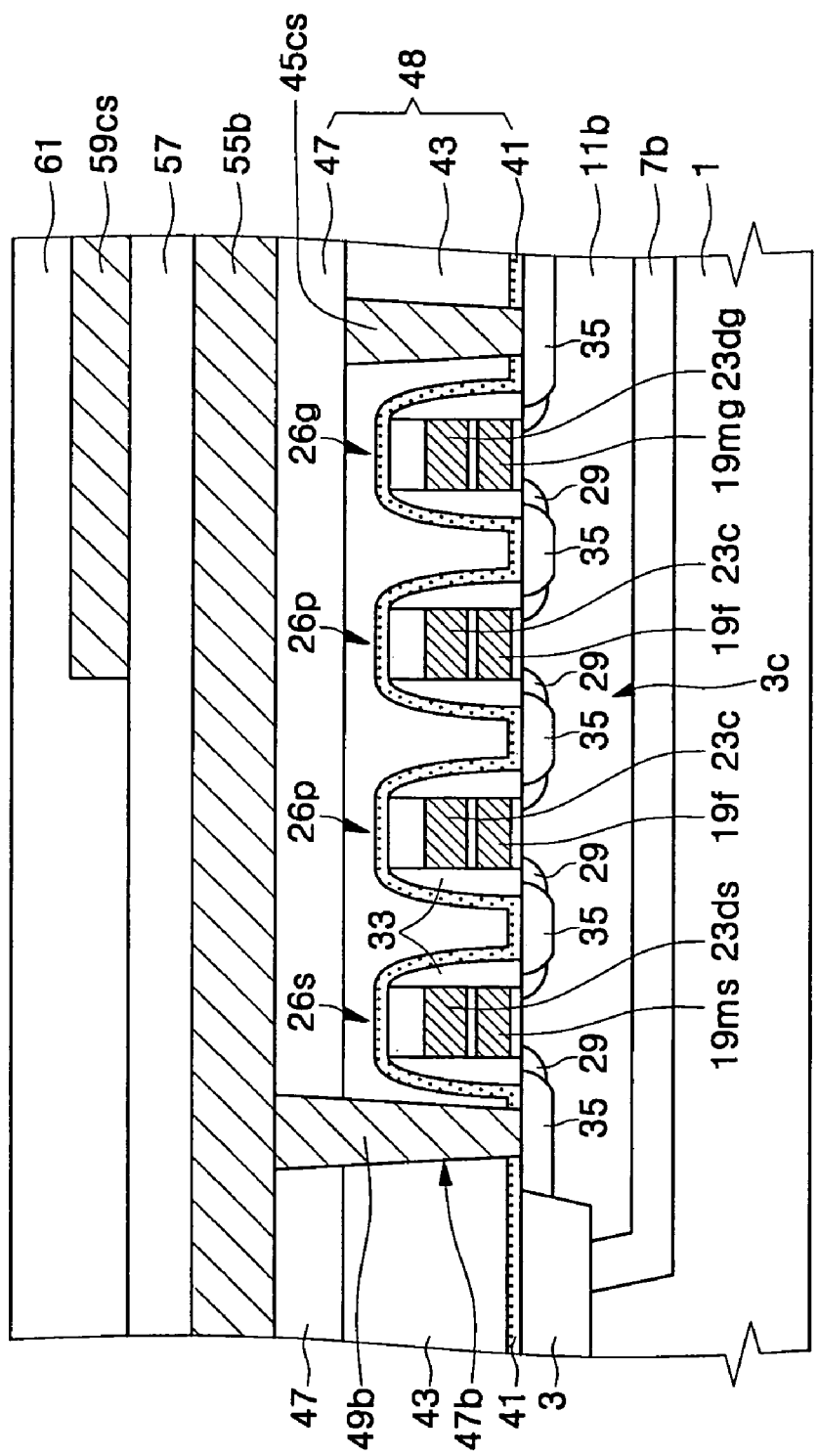

METHODS OF FABRICATING SEMICONDUCTOR INTEGRATED CIRCUIT DEVICES INCLUDING SRAM CELLS AND FLASH MEMORY CELLS

CROSS-REFERENCE TO RELATED APPLICATION

This U.S. non-provisional patent application claims priority under 35 U.S.C. § 119 of Korean Patent Application No. 10-2004-0114333, filed on Dec. 28, 2004 in the Korean Intellectual Property Office, the disclosure of which is incorporated herein in its entirety by reference.

FIELD OF THE INVENTION

The present invention relates to semiconductor integrated circuit (IC) devices and methods of fabricating the same and, more particularly, to semiconductor integrated circuit devices including static random access memory (SRAM) cells and flash memory cells and methods of fabricating the same.

BACKGROUND OF THE INVENTION

Semiconductor IC devices include memory devices and logic devices. The memory devices can be classified into volatile memory devices and non-volatile memory devices. The volatile memory devices may include DRAM devices and SRAM devices, and the non-volatile memory devices may include flash memory devices, phase change memory devices, ferroelectric memory devices and magnetic random access memory (MRAM) devices.

Recently, embedded memory logic devices including the memory devices and the logic device fabricated on a single chip have been widely used. The embedded memory logic devices include memory cells for storing data, peripheral circuits for driving the memory cells and logic circuits for processing the data in the memory cells.

The embedded memory logic devices may include both of the volatile memory cells and the non-volatile memory cells as the memory cells. For example, the memory cells may include both of the SRAM cells and the flash memory cells.

A method of fabricating a semiconductor device including full complementary metal-oxide-semiconductor (CMOS)SRAM cells having a single gate structure and flash memory cells having a stacked gate structure is disclosed in Korean Patent No. 10-0344828 to Suh et al., entitled "Method of Fabricating a Semiconductor Device". According to Suh et al., methods of forming stacked gate patterns of the flash memory cells with single gate patterns of the SRAM cells are provided. However, control gate electrodes of the stacked gate patterns may not be self-aligned with floating gates thereof.

In addition, a semiconductor device including the flash memory cells having the stacked gate structure and SRAM cells having the single gate structure is disclosed in U.S. Pat. No. 6,406,959 B2 to Prall et al., entitled "Method of Forming Flash Memory, Method of Forming Flash Memory and SRAM Circuitry, and Etching Methods".

SUMMARY OF THE INVENTION

In an aspect of the present invention, embedded semiconductor IC devices having at least two different type memory cells are provided. The semiconductor IC devices include an IC substrate having an SRAM cell region, a flash memory cell region, and a logic circuit region. An isolation layer is provided in a predetermined region of the substrate. The isolation layer defines an SRAM cell active region, a flash memory cell active region, and a logic transistor active region in the SRAM cell region, the flash memory cell region, and the logic circuit region, respectively. An SRAM cell gate pattern is disposed to cross over the SRAM cell active region. The SRAM cell gate pattern includes a main SRAM cell gate electrode and a dummy SRAM cell gate electrode which are sequentially stacked. A flash memory cell gate pattern is disposed to cross over the flash memory cell active region. The flash memory cell gate pattern includes a control gate electrode crossing over the flash memory cell active region and a floating gate interposed between the control gate electrode and the flash memory cell active region. A logic gate pattern is provided to cross over the logic transistor active region. The logic gate pattern includes a main logic gate electrode and a dummy logic gate electrode which are sequentially stacked.

In some embodiments of the present invention, a string selection gate pattern and a ground selection gate pattern may be additionally disposed at both sides of the flash memory cell gate pattern, respectively. The string selection gate pattern and the ground selection gate pattern may also cross over the flash memory cell active region. The string selection gate pattern may include a main string selection gate electrode and a dummy string selection gate electrode which are sequentially stacked, and the ground selection gate pattern may include a main ground selection gate electrode and a dummy ground selection gate electrode which are sequentially stacked.

In other embodiments, the gate patterns may further include an inter-gate insulating layer between the main gate electrodes and the dummy gate electrodes as well as between the floating gate and the control gate electrode.

In still other embodiments, a lower interlayer insulating layer and a molding layer may be sequentially stacked on the substrate having the gate patterns.

In yet other embodiments, an SRAM cell local interconnection may be provided in the molding layer of the SRAM cell region. In this case, the SRAM cell local interconnection may pass through the lower interlayer insulating layer, the dummy SRAM cell gate electrode and the inter-gate insulating layer to be in contact with the main SRAM cell gate electrode.

In yet still other embodiments, a flash memory bit line may be disposed in the molding layer of the flash memory cell region. In this case, the flash memory bit line may be electrically connected to the flash memory cell active region through a bit line contact hole passing through the lower interlayer insulating layer.

In further embodiments, a string selection gate interconnection and a ground selection gate interconnection may be disposed in the molding layer of the flash memory cell region. In this case, the string selection gate interconnection may be electrically connected to the main string selection gate electrode through a string selection gate interconnection contact hole passing through the lower interlayer insulating layer, the dummy string selection gate electrode and the inter-gate insulating layer, and the ground selection gate interconnection may be electrically connected to the main ground selection gate electrode through ground selection gate interconnection contact holes passing through the lower interlayer insulating layer, the dummy ground selection gate electrode and the inter-gate insulating layer.

In still further embodiments, a logic gate interconnection may be disposed in the molding layer of the logic circuit region. In this case, the logic gate interconnection may be electrically connected to the main logic gate electrode through a logic gate interconnection contact hole passing through the lower interlayer insulating layer, the dummy logic gate electrode and the inter-gate insulating layer.

In yet still further embodiments, an intermediate interlayer insulating layer may be disposed on the molding layer. An SRAM cell bit line may be disposed on the intermediate interlayer insulating layer in the SRAM cell region. The SRAM cell bit line may be electrically connected to the SRAM cell active region. In addition, an upper power supply line and an upper ground line may be disposed on the intermediate interlayer insulating layer in the SRAM cell region. In addition, a flash memory cell ground line may be disposed on the intermediate interlayer insulating layer in the flash memory cell region. Moreover, logic signal lines may be disposed on the intermediate interlayer insulating layer in the logic circuit region.

In another aspect of the present invention, the semiconductor IC devices include an IC substrate having an SRAM cell region, a flash memory cell region, and a logic circuit region. An isolation layer is provided in a predetermined region of the substrate. The isolation layer defines an access/driver transistor active region and a load transistor active region in the SRAM cell region. In addition, the isolation layer defines a flash memory cell active region and first to fourth logic transistor active regions in the flash memory cell region and the logic circuit region, respectively. An access gate pattern is disposed to cross over first and second portions of the access/driver transistor active region. The access gate pattern includes a main access gate electrode and a dummy access gate electrode which are sequentially stacked. A first common gate pattern is disposed to cross over the access/driver transistor active region between the first and second portions as well as the load transistor active region. The first common gate pattern includes a first main common gate electrode and a first dummy common gate electrode which are sequentially stacked. A second common gate pattern is disposed to cross over the access/driver transistor active region between the first common gate pattern and the second portion as well as the load transistor active region. The second common gate pattern includes a second main common gate electrode and a second dummy common gate electrode which are sequentially stacked. A flash memory cell gate pattern is disposed to cross over the flash memory cell active region. The flash memory cell gate pattern includes a control gate electrode crossing over the flash memory cell active region as well as a floating gate between the control gate electrode and the flash memory cell active region. A first NMOS gate pattern is disposed to cross over the first logic transistor active region. The first NMOS gate pattern includes a first main NMOS gate electrode and a first dummy NMOS gate electrode which are sequentially stacked. In addition, a first PMOS gate pattern is disposed to cross over the second logic transistor active region. The first PMOS gate pattern includes a first main PMOS gate electrode and a first dummy PMOS gate electrode which are sequentially stacked. Further, a second NMOS gate pattern is disposed to cross over the third logic transistor active region. The second NMOS gate pattern includes a second main NMOS gate electrode and a second dummy NMOS gate electrode which are sequentially stacked. Moreover, a second PMOS gate pattern is disposed to cross over the fourth logic transistor active region. The second PMOS gate pattern includes a second main PMOS gate electrode and a second dummy PMOS gate electrode which are sequentially stacked.

In some embodiments, first to third deep N wells may be provided in the substrate of the SRAM cell region, the substrate of the flash memory cell region and the substrate of the logic circuit region, respectively. The third deep N well may surround the fourth logic transistor active region. In addition, a first pocket P well may be provided in the first deep N well, and the first pocket P well may surround the access/driver transistor active region. Further, a second pocket P well may be provided in the second deep N well to surround the flash memory cell active region. Moreover, a third pocket P well may be provided in the substrate of the logic circuit region to surround the first logic transistor active region.

In other embodiments, a first shallow N well may be provided in the first deep N well to surround the load transistor active region. In addition, a second shallow N well may be provided in the substrate of the logic circuit region to surround the second logic transistor active region.

In still another aspect of the present invention, there is provided methods of fabricating an embedded semiconductor IC device having at least two different type memory cells. The methods include providing an IC substrate having an SRAM cell region, a flash memory cell region and a logic circuit region. An isolation layer is formed in a predetermined region of the substrate to define an SRAM cell active region, a flash memory cell active region and a logic transistor active region in the SRAM cell region, the flash memory cell region and the logic circuit region, respectively. An SRAM cell gate pattern, a flash memory cell gate pattern, and a logic gate pattern are formed to cross over the SRAM cell active region, the flash memory cell active region and the logic transistor active region, respectively. The SRAM cell gate pattern is formed to have a main SRAM cell gate electrode and a dummy SRAM cell gate electrode which are sequentially stacked, the flash memory cell gate pattern is formed to have a control gate electrode crossing over the flash memory cell active region and a floating gate interposed between the control gate electrode and the flash memory cell active region, and the logic gate pattern is formed to have a main logic gate electrode and a dummy logic gate electrode which are sequentially stacked.

In some embodiments of the present invention, during formation of the gate patterns, a string selection gate pattern and a ground selection gate pattern may be formed to cross over the flash memory cell active region. The string selection gate pattern and the ground selection gate pattern are formed at both sides of the flash memory cell gate pattern, respectively. The string selection gate pattern may be formed to have a main string selection gate electrode and a dummy string selection gate electrode which are sequentially stacked, and the ground selection gate pattern may be formed to have a main ground selection gate electrode and a dummy ground selection gate electrode which are sequentially stacked.

In other embodiments, forming the gate patterns may comprises forming gate insulating layers on the SRAM cell active region and the logic transistor active region as well as a tunneling insulating layer on the flash memory cell active region, sequentially forming a lower gate conductive layer, an inter-gate insulating layer and an upper gate conductive layer on the substrate having the gate insulating layers and the tunneling insulating layer, and patterning the upper gate conductive layer, the inter-gate insulating layer, the lower gate conductive layer, the gate insulating layers and the tunneling insulating layer.

In still other embodiments, the dummy SRAM cell gate electrode, the dummy string selection gate electrode, the dummy ground selection gate electrode, the dummy logic gate electrode and the inter-gate insulating layer may be patterned to form butting contact regions that expose the main SRAM cell gate electrode, the main string selection gate electrode, the main ground selection gate electrode and the main logic gate electrode. In addition, a lower interlayer insulating layer and a molding layer may be sequentially formed on the substrate having the butting contact regions.

In yet other embodiments, an SRAM cell local interconnection, a flash memory bit line, a string selection gate interconnection, a ground selection gate interconnection and a logic gate interconnection may be formed in the molding layer. The SRAM cell local interconnection, the string selection gate interconnection, the ground selection gate interconnection and the logic gate interconnection may be electrically connected to the main SRAM cell gate electrode, the main string selection gate electrode, the main ground selection gate electrode and the main logic gate electrode through the butting contact regions, respectively. In addition, the flash memory bit line may be electrically connected to the flash memory cell active region.

In yet still other embodiments, an intermediate interlayer insulating layer may be formed on the molding layer. An SRAM cell bit line, a flash memory cell ground line and a logic signal line may be formed on the intermediate interlayer insulating layer. The SRAM cell bit line may be electrically connected to the SRAM cell active region, the flash memory cell ground line may be eclectically connected to the flash memory cell active region which is adjacent to the ground selection gate pattern and located opposite the string selection gate pattern, and the logic signal line may be electrically connected to the main logic gate electrode.

In yet still another aspect, the methods of fabricating the embedded semiconductor IC device include providing an IC substrate having an SRAM cell region, a flash memory cell region and a logic circuit region. An isolation layer is formed in a predetermined region of the substrate to define an access/driver transistor active region and a load transistor active region in the SRAM cell region, a flash memory cell active region in the flash memory cell region, and first to fourth logic transistor active regions in the logic circuit region. An access gate pattern is formed to cross over first and second portions of the access/driver transistor active region. A first common gate pattern is formed to cross over the access/driver transistor active region between the first and second portions as well as the load transistor active region, during formation of the access gate pattern. In addition, a second common gate pattern is formed to cross over the access/driver transistor active region between the first common gate pattern and the second portion as well as the load transistor active region, during formation of the access gate pattern. Moreover, a flash memory cell gate pattern is formed to cross over the flash memory cell active region during formation of the access gate pattern. The flash memory cell gate pattern is formed to include a control gate electrode crossing over the flash memory cell active region as well as floating gates interposed between the control gate electrode and the flash memory cell active region. Further, during formation of the access gate pattern, a first NMOS gate pattern, a first PMOS gate pattern, a second NMOS gate pattern and a second PMOS gate pattern are formed to cross over the first to fourth logic transistor active regions respectively. The access gate pattern is formed to have a main access gate electrode and a dummy access gate electrode which are sequentially stacked, the first common gate pattern is formed to have a first main common gate electrode and a first dummy common gate electrode which are sequentially stacked, and the second common gate pattern is formed to have a second main common gate electrode and a second dummy common gate electrode which are sequentially stacked. In addition, the first NMOS gate pattern is formed to have a first main NMOS gate electrode and a first dummy NMOS gate electrode which are sequentially stacked, the first PMOS gate pattern is formed to have a first main PMOS gate electrode and a first dummy PMOS gate electrode which are sequentially stacked, the second NMOS gate pattern is formed to have a second main NMOS gate electrode and a second dummy NMOS gate electrode which are sequentially stacked, and the second PMOS gate pattern is formed to have a second main PMOS gate electrode and a second dummy PMOS gate electrode which are sequentially stacked.

In some embodiments of the present invention, first to third deep N wells may be formed in the substrate of the SRAM cell region, the substrate of the flash memory cell region and a first portion of the substrate of the logic circuit region, respectively. Further, first to third pocket P wells may be formed in the first deep N well, the second deep N well, and a second portion of the substrate of the logic circuit region, respectively. Moreover, first and second shallow N wells may be formed in the first deep N well and a third portion of the substrate of the logic circuit region, respectively. The first shallow N well is formed to be adjacent to the first pocket P well. The first to third pocket P wells may be formed to surround the access/driver transistor active region, the flash memory cell active region and the first logic transistor active region, respectively, and the first and second shallow N wells may be formed to surround the load transistor active region and the second logic transistor active region, respectively. In addition, the third deep N well may be formed to surround the fourth logic transistor active region.

In other embodiments, the first to third deep N wells, the first to third pocket P wells, and the first and second shallow N wells may be formed prior to formation of the isolation layer. Alternatively, the first to third deep N wells, the first to third pocket P wells, and the first and second shallow N wells may be formed after formation of the isolation layer.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings:

FIGS. 2A to 12A are cross sectional views taken along line I-I' of FIG. 1 to illustrate semiconductor IC devices according to some embodiments of the present invention and methods of fabricating the same;

FIGS. 2B to 12B are cross sectional views taken along line II-II' of FIG. 1 to illustrate semiconductor IC devices according to some embodiments of the present invention and methods of fabricating the same;

FIGS. 2C to 12C are cross sectional views taken along line III-III' of FIG. 1 to illustrate semiconductor IC devices according to some embodiments of the present invention and methods of fabricating the same;

DETAILED DESCRIPTION OF THE INVENTION

Figure 1:
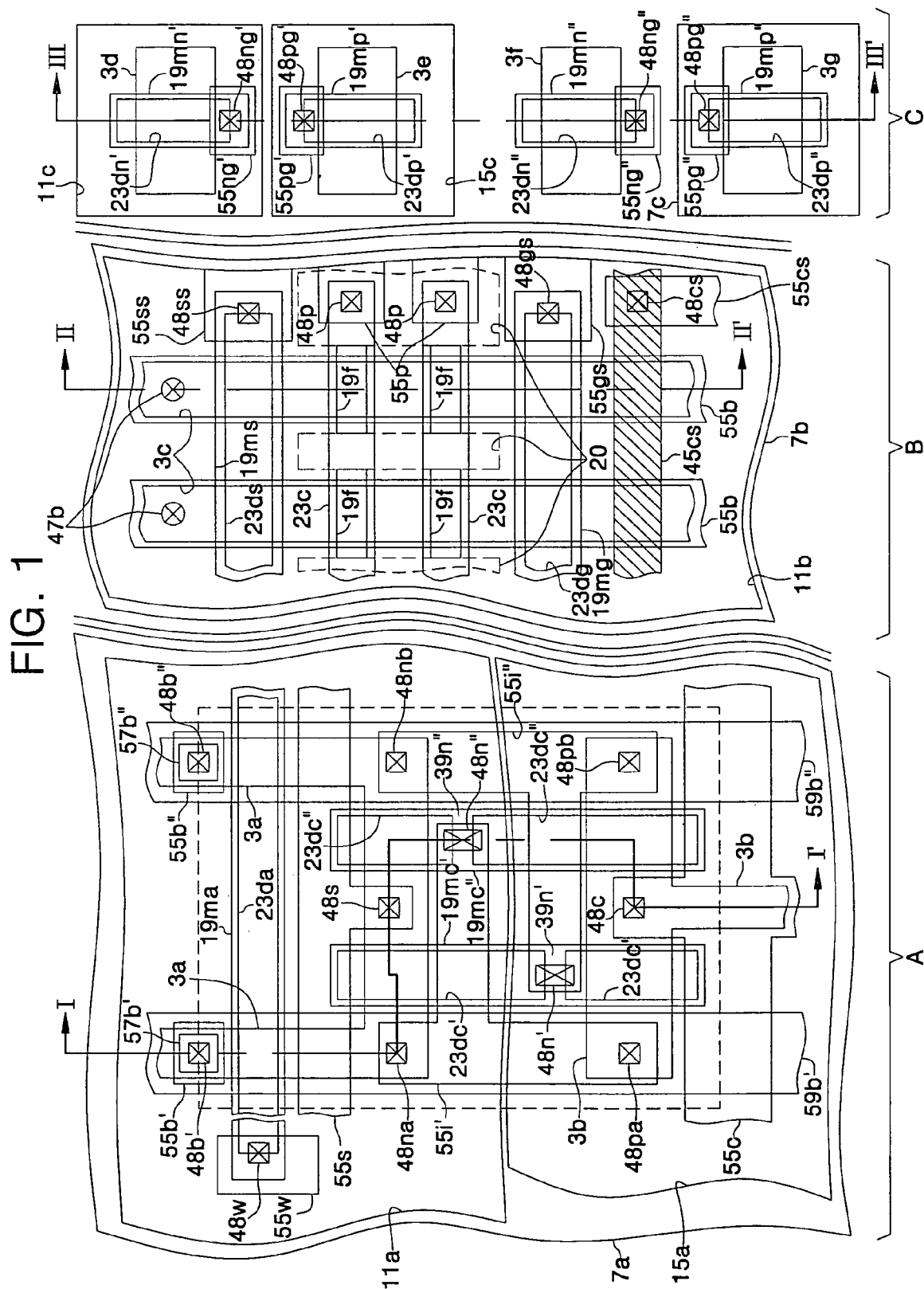
FIG. 1 is a plan view illustrating a semiconductor IC device according to some embodiments of the present invention.
Figure 2C:
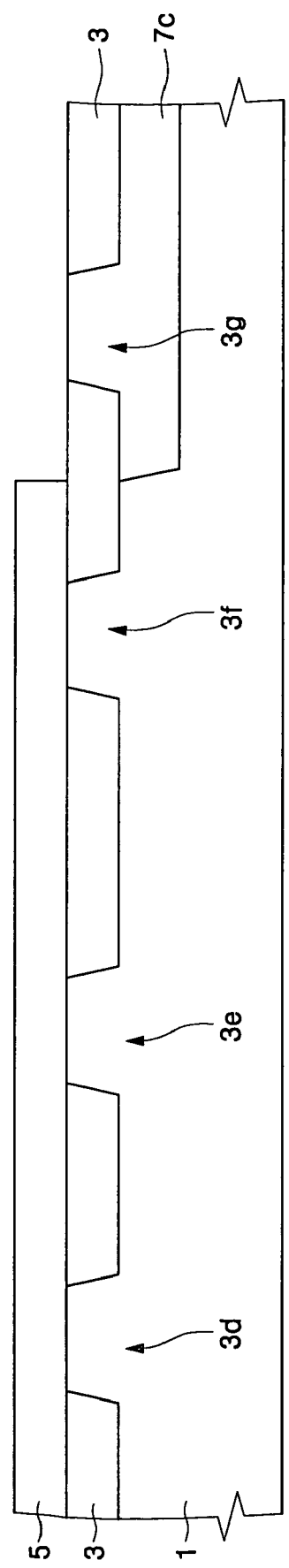
Figure 3A:
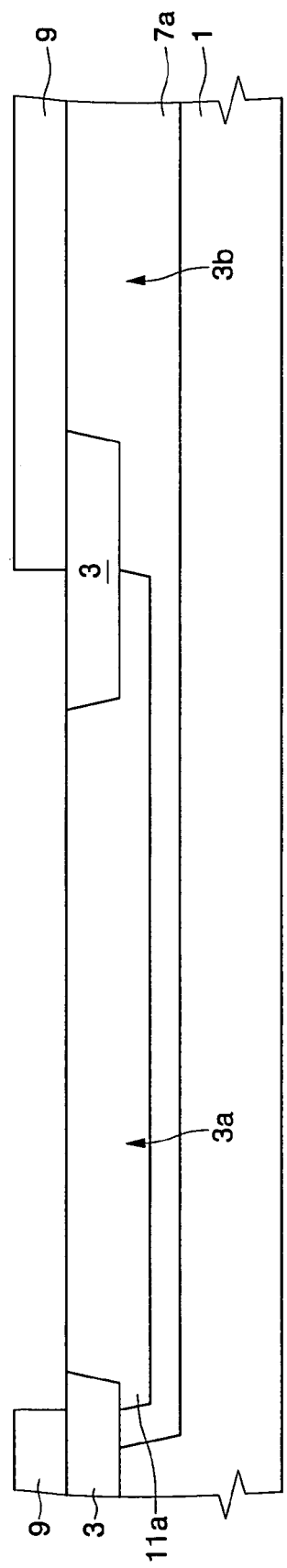
Figure 3B:
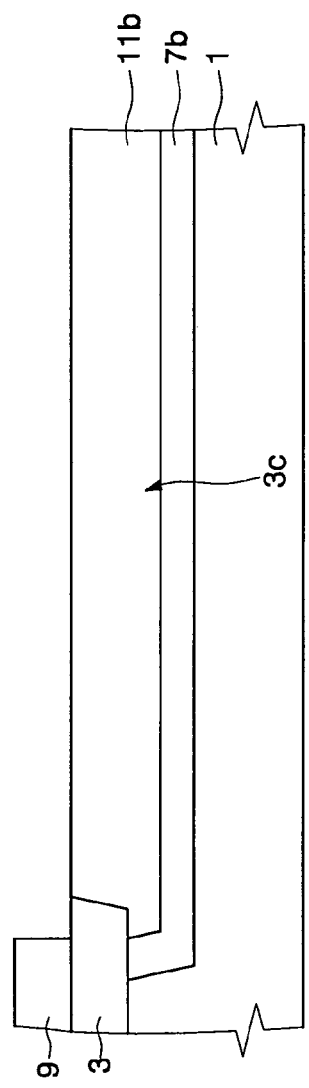
Figure 3C:
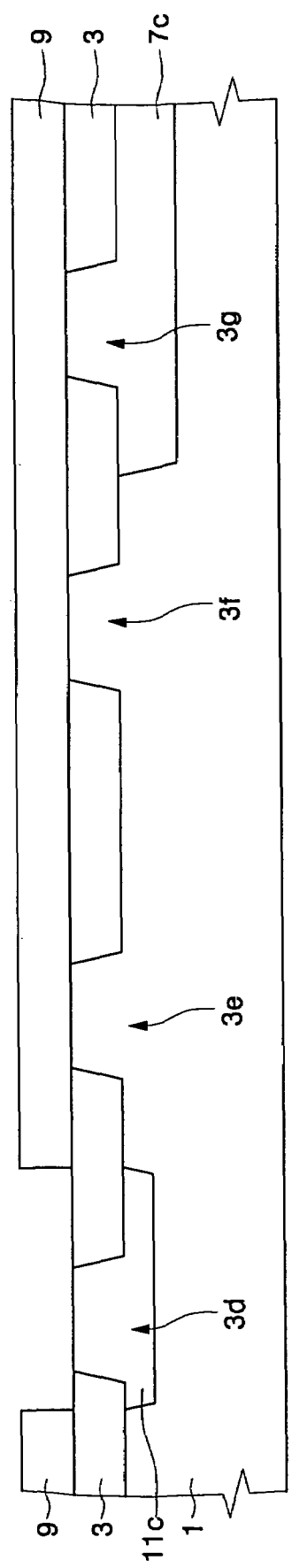
Figure 4A:
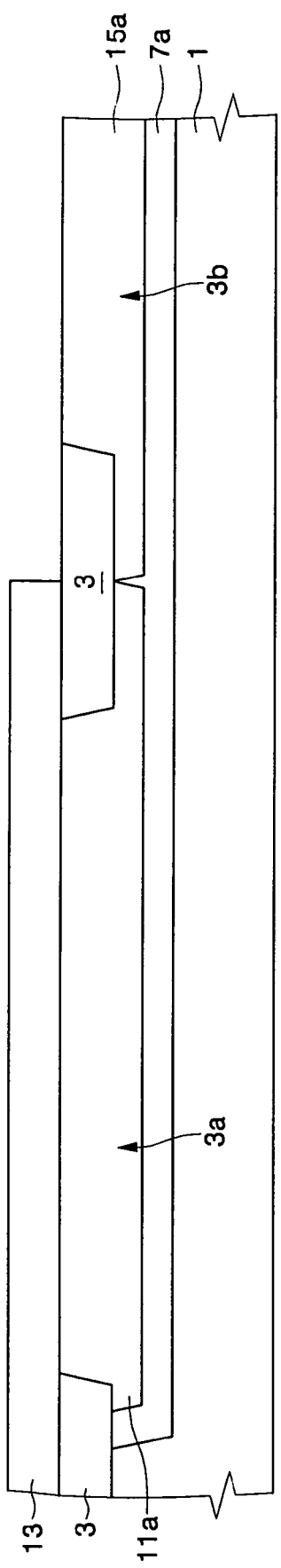
Figure 4B:
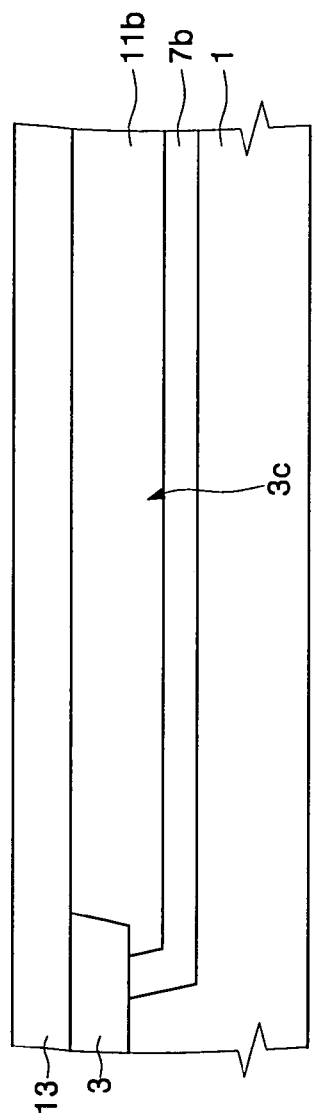
Figure 4C:
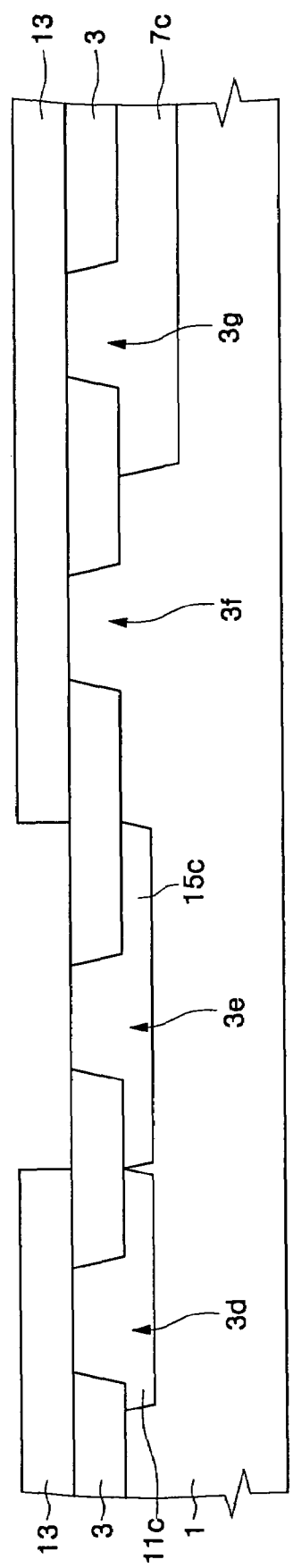
Figure 5A:
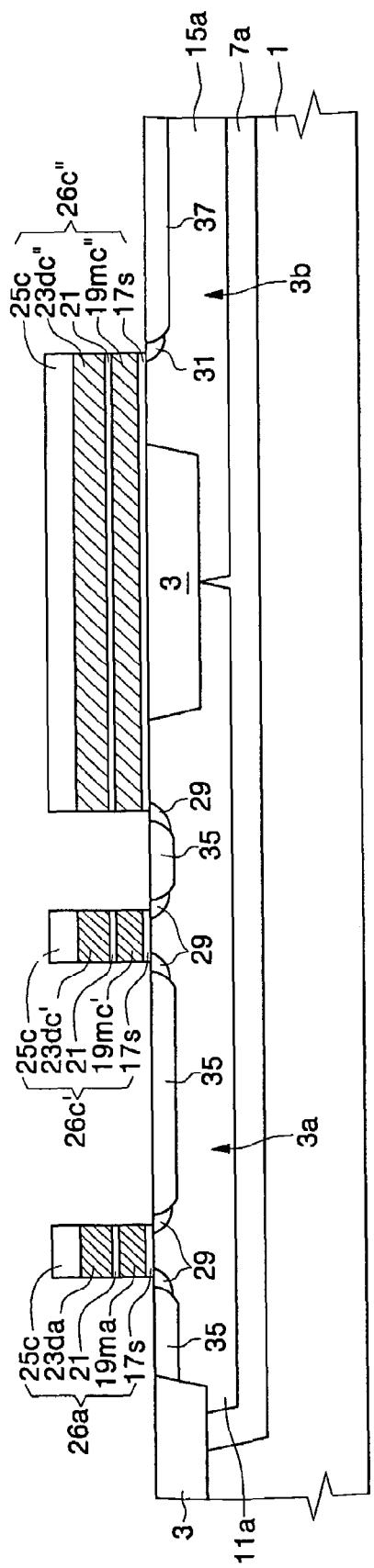
Figure 5B:
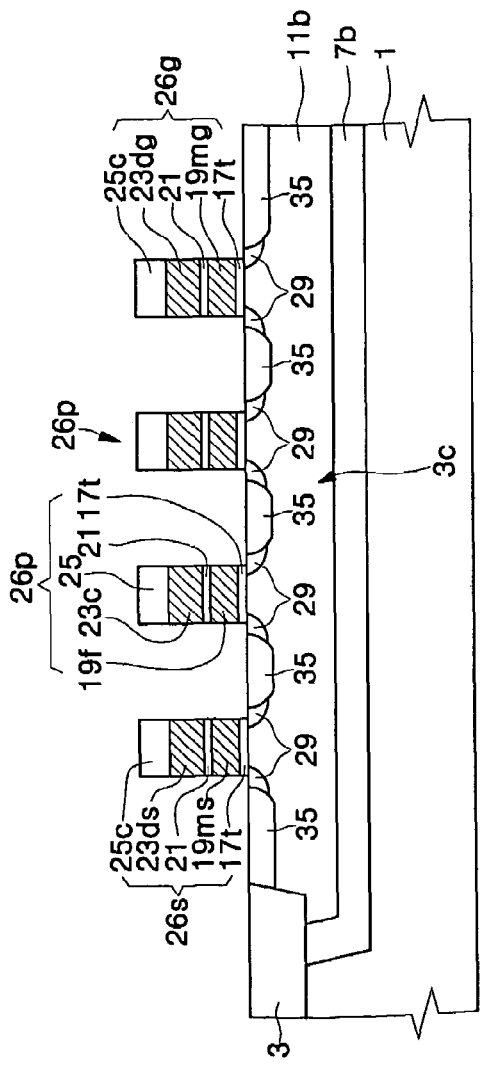
Figure 5C:
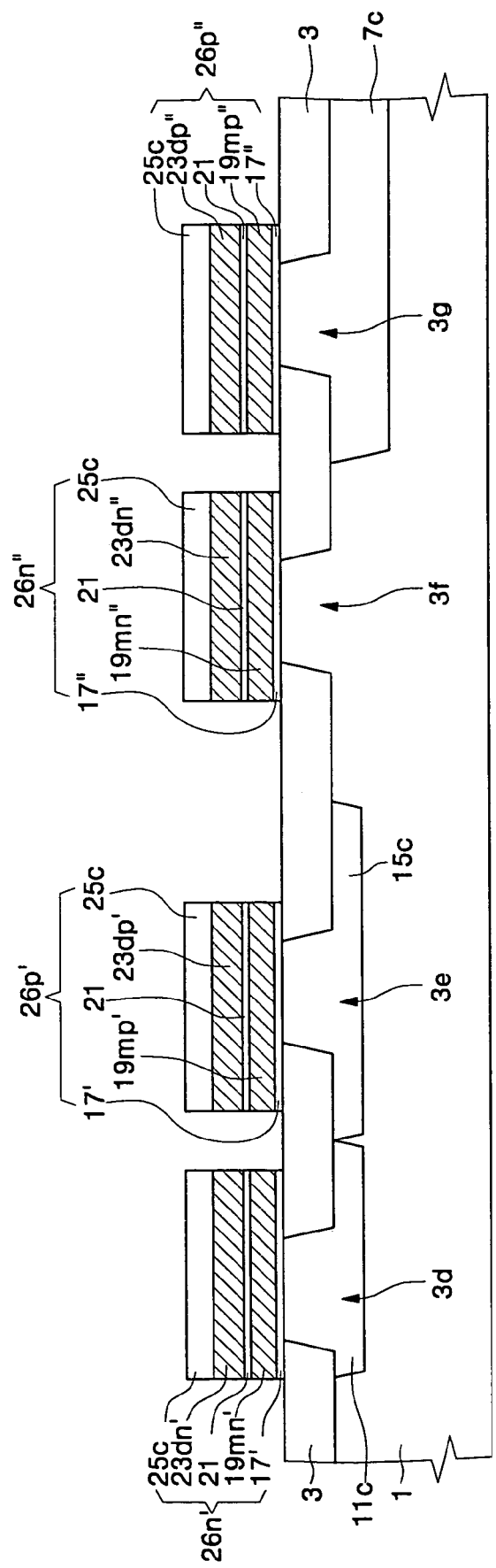
Figure 6A:
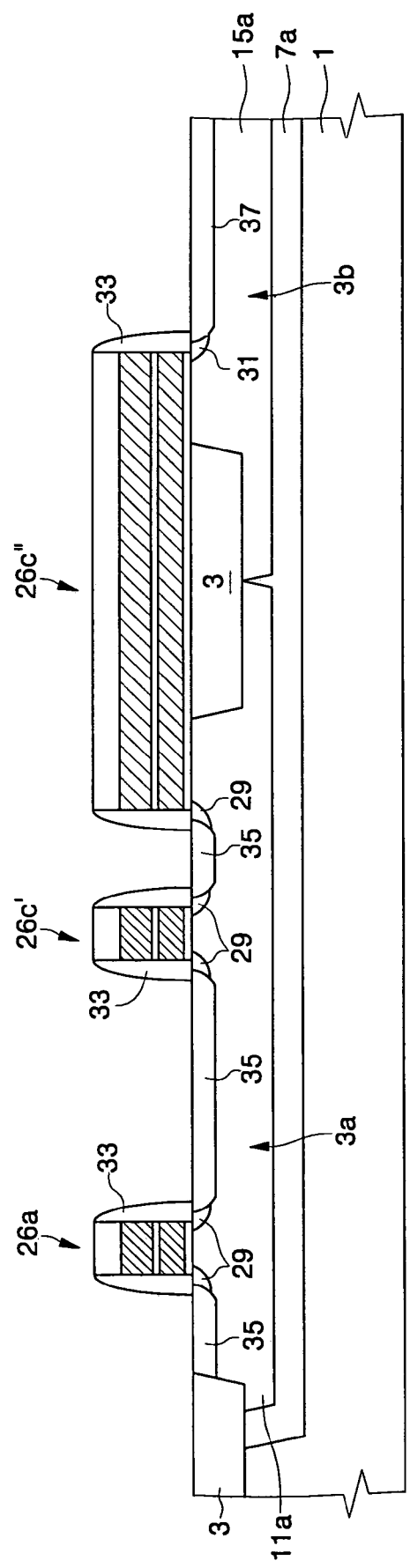
Figure 6C:
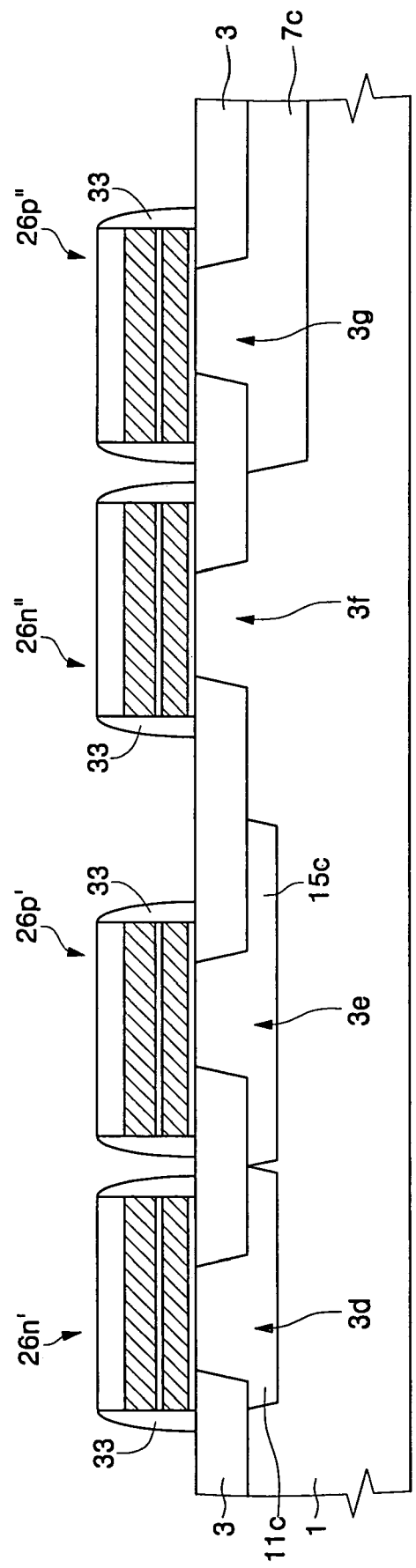
Figure 7A:
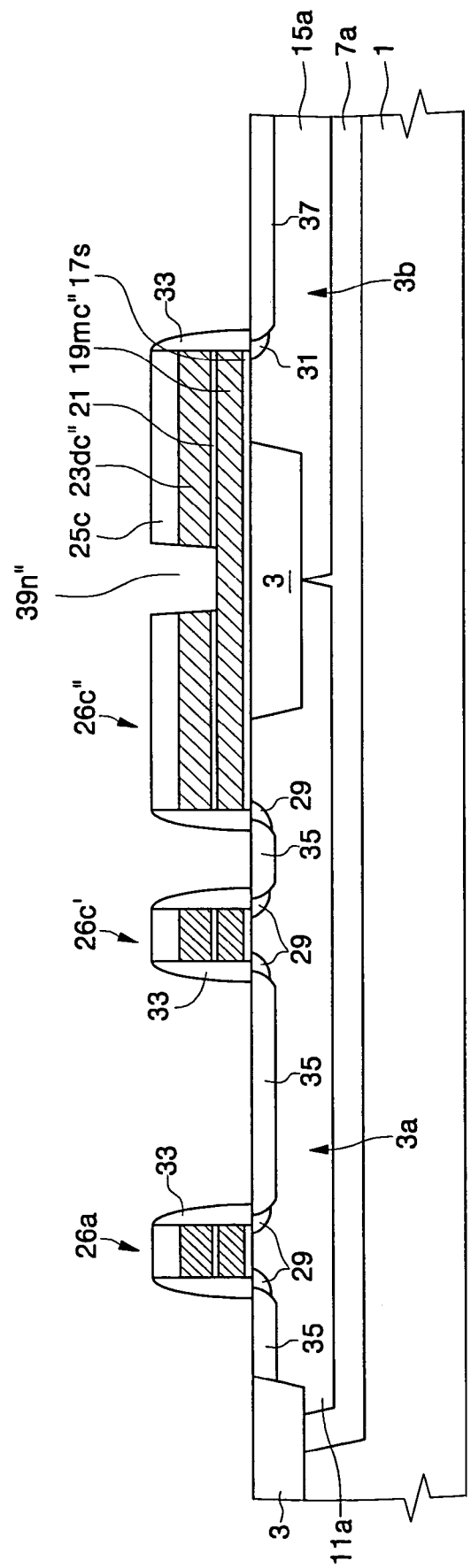
Figure 7B:
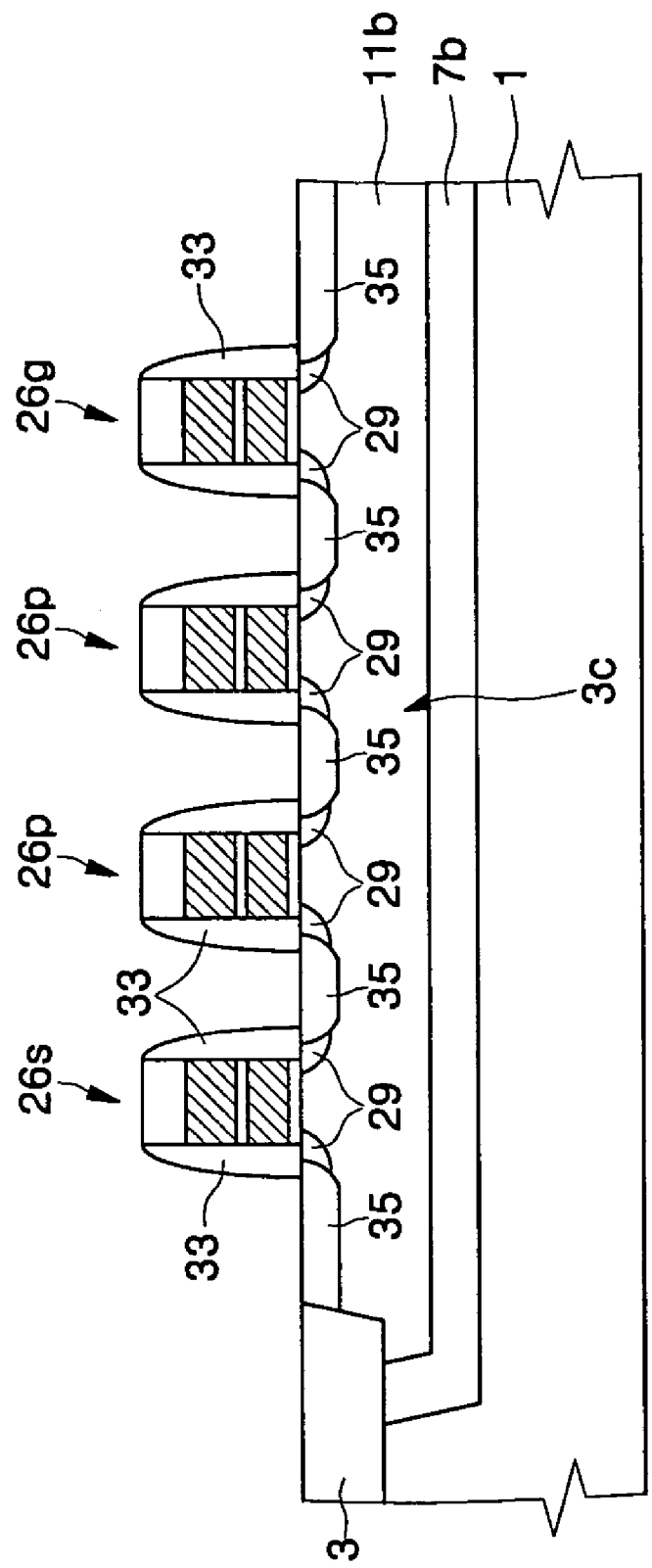
Figure 7C:
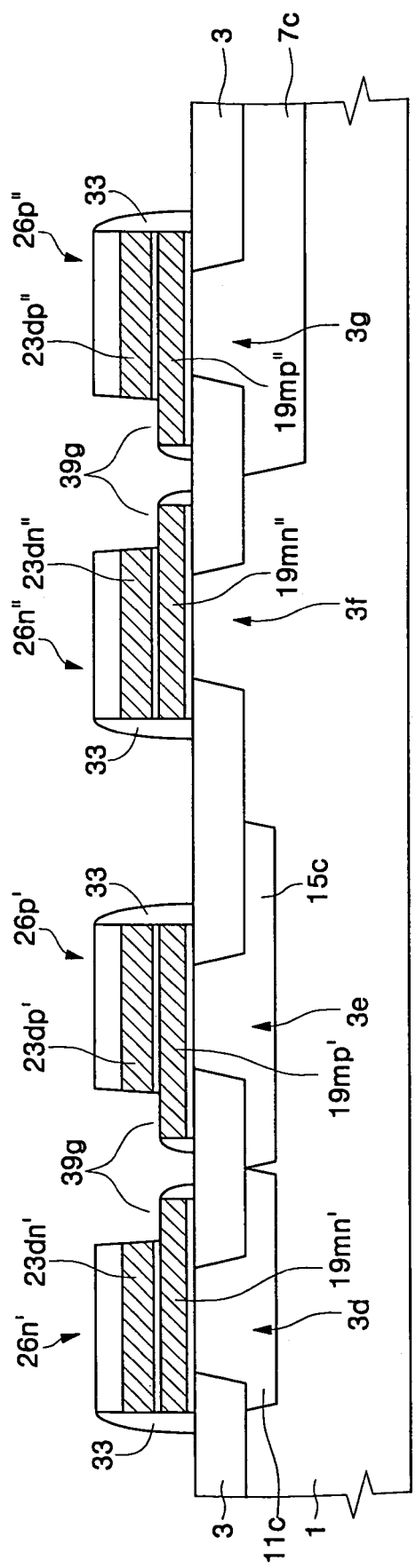
Figure 8B:
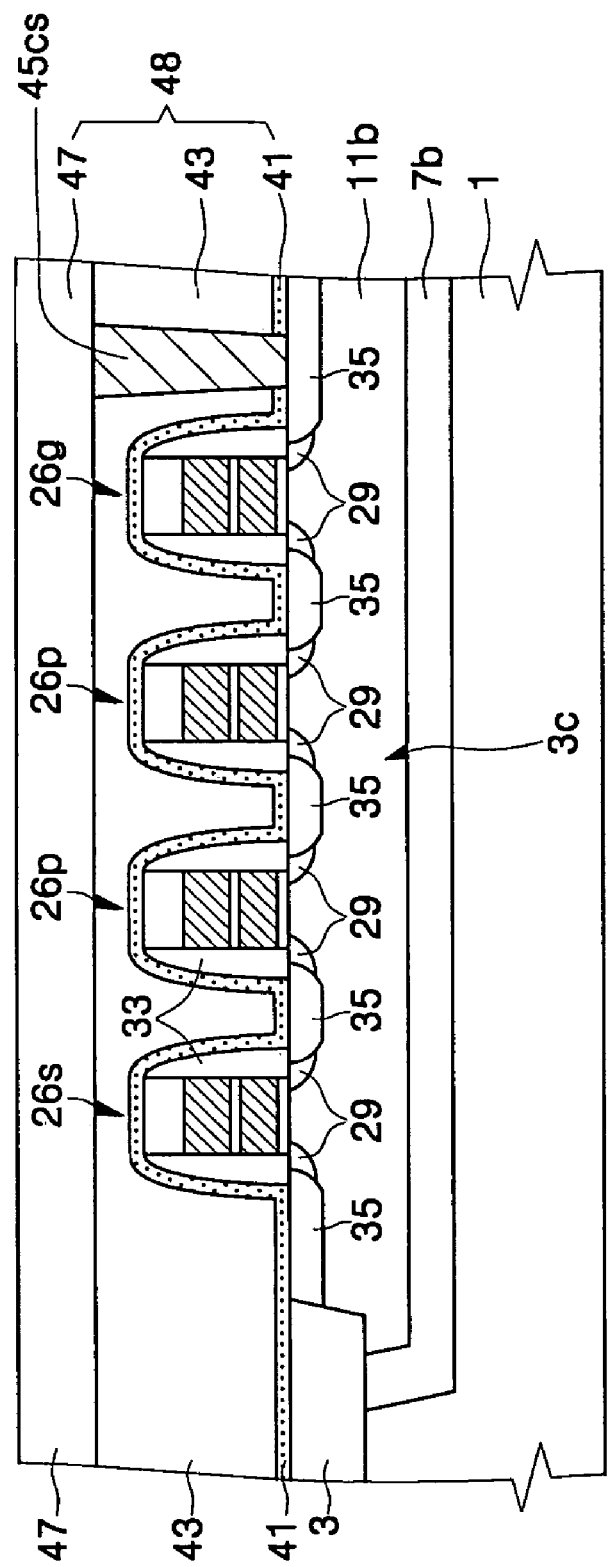
Figure 9A:
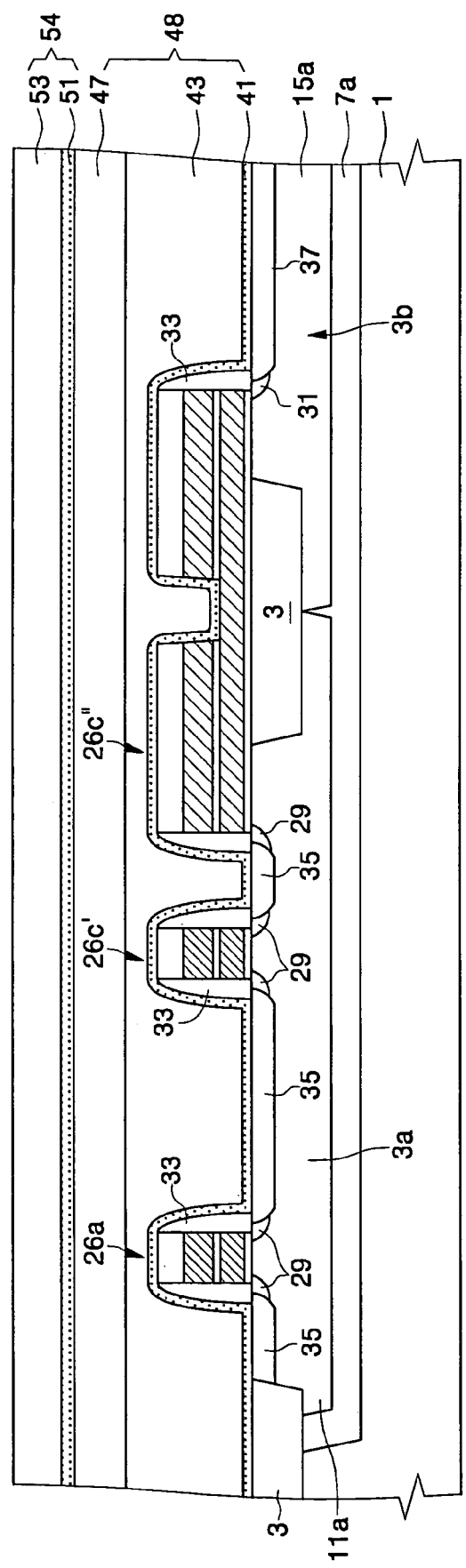
Figure 9B:
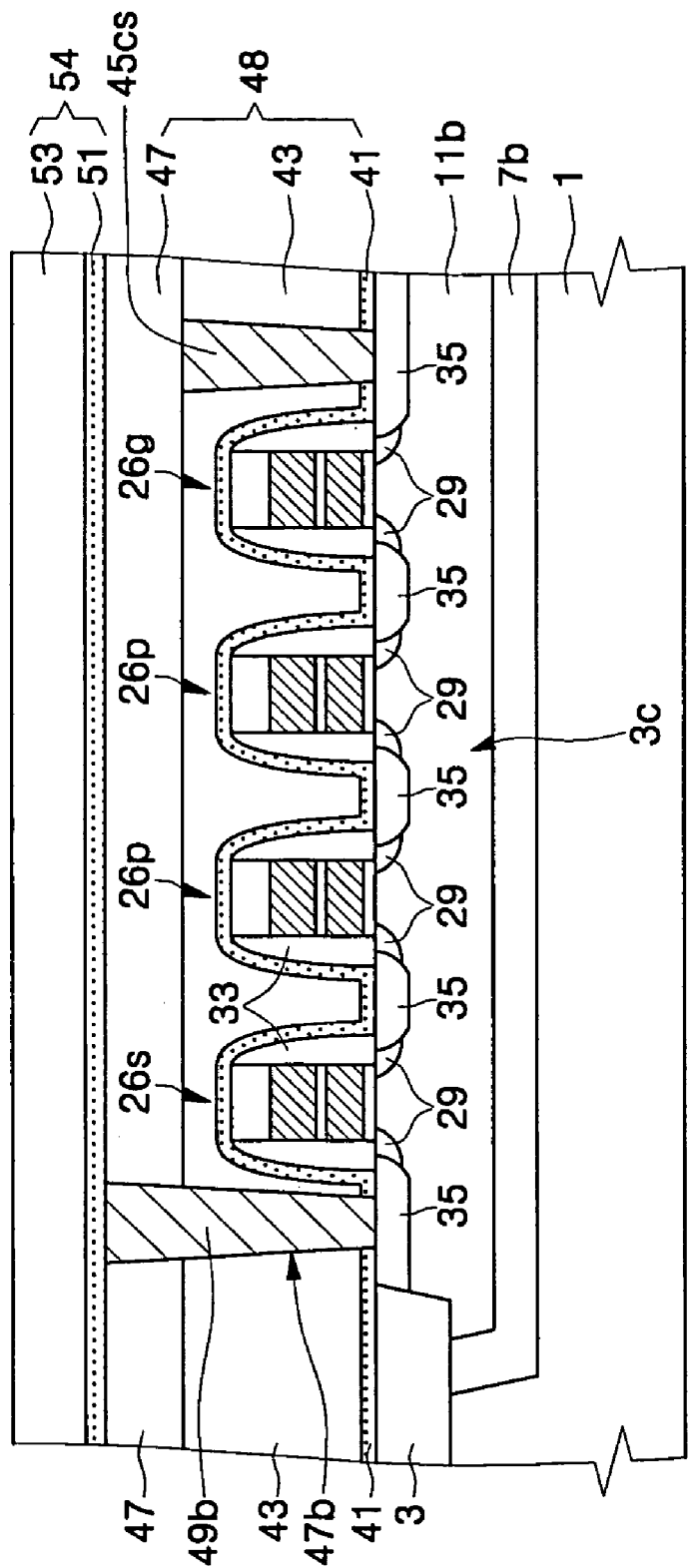
Figure 9C:
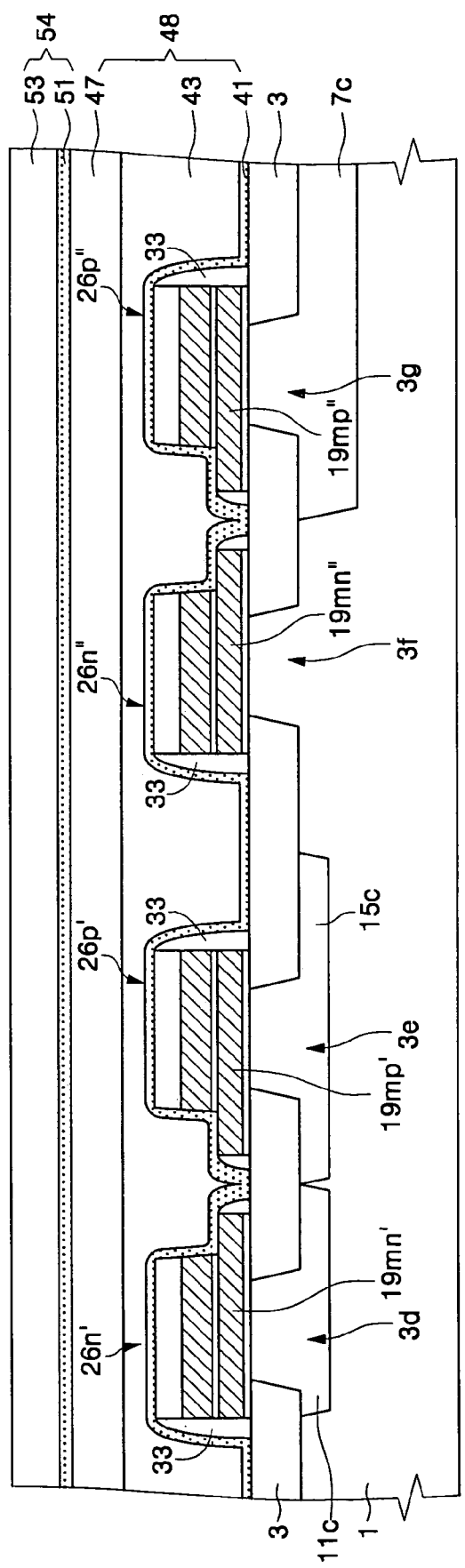
Figure 10A:
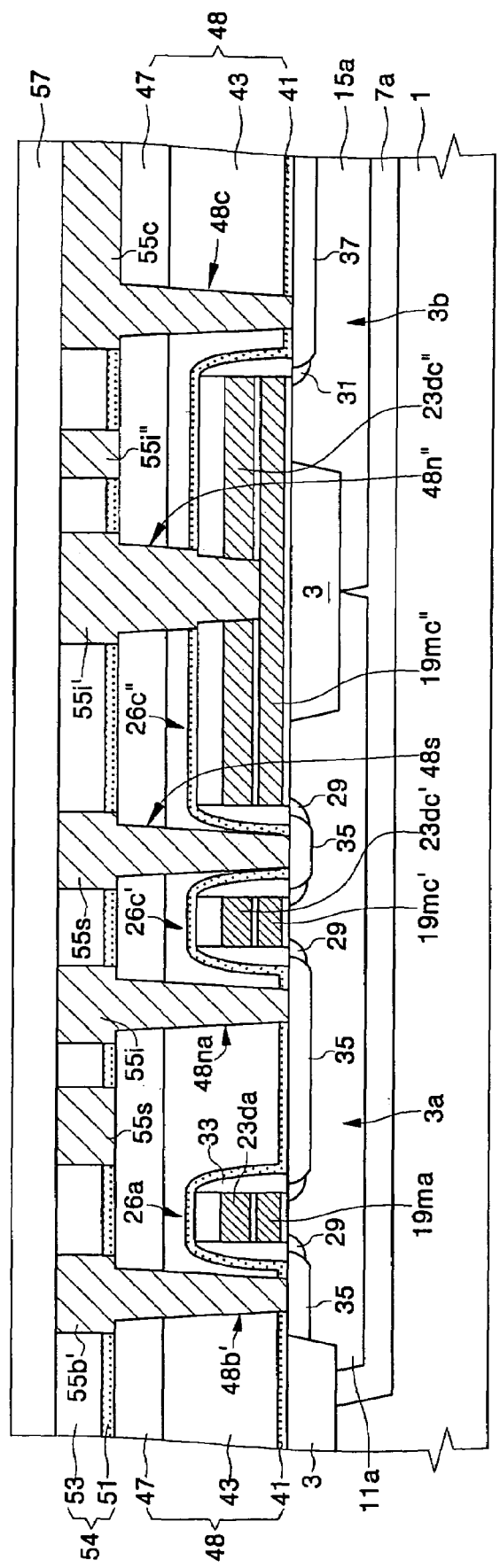
Figure 10B:
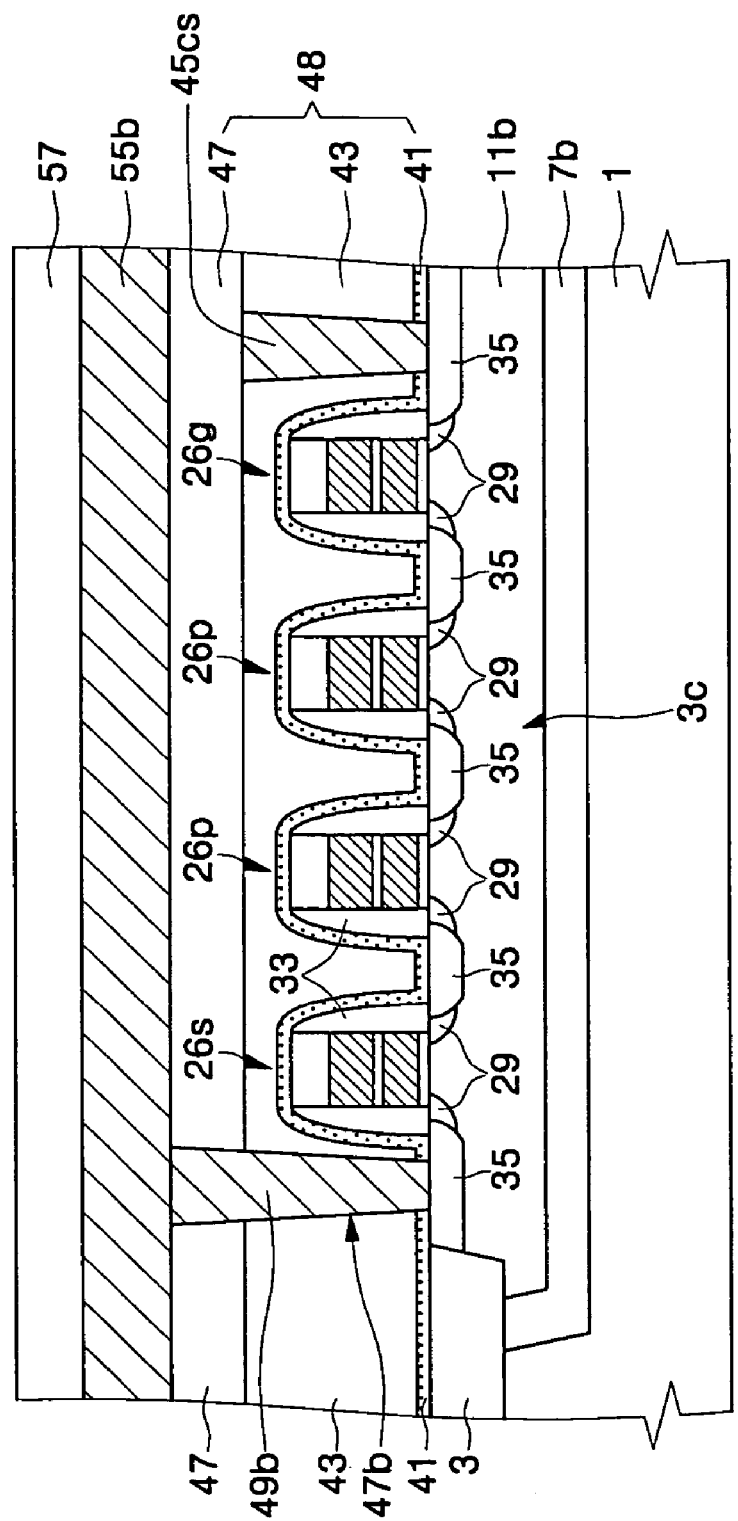
Figure 10C:
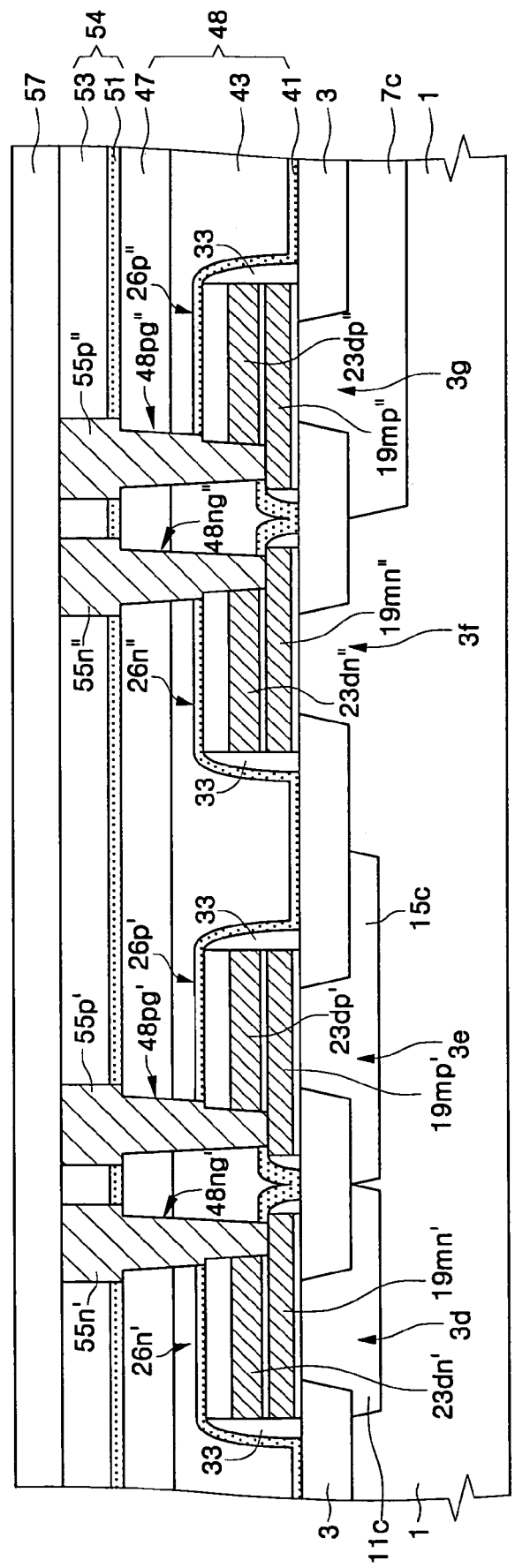
Figure 11A:
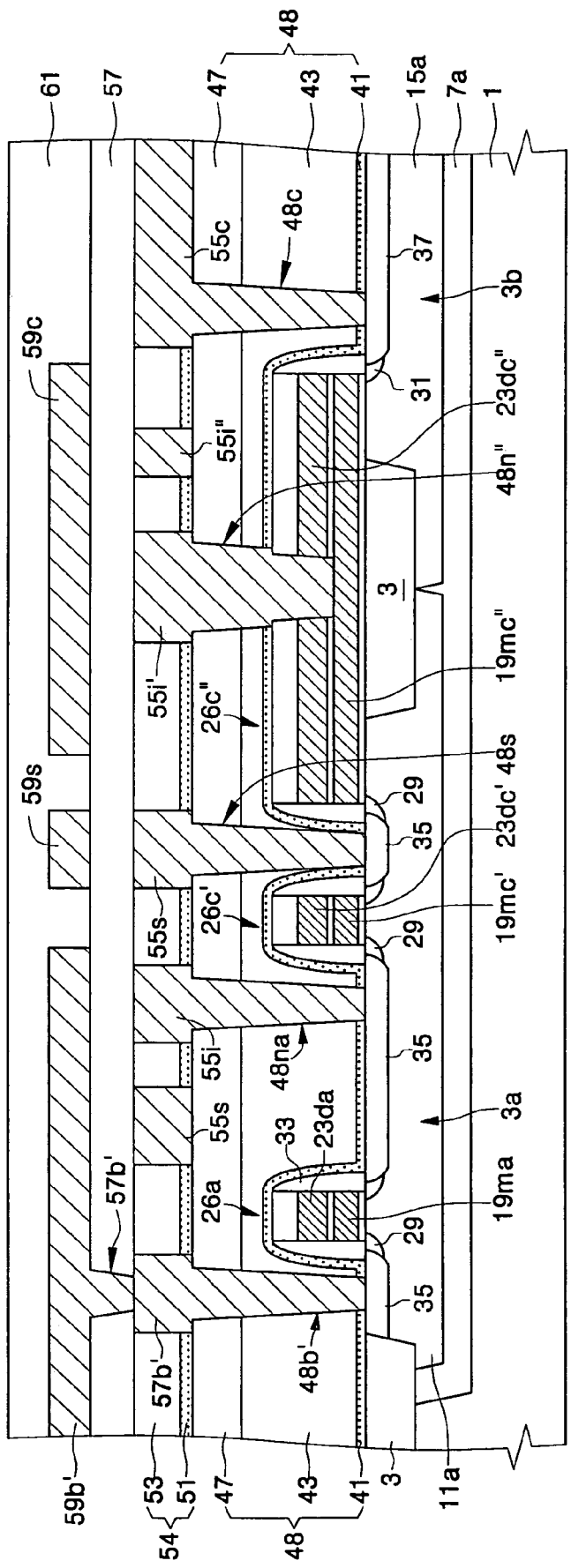
Figure 11C:
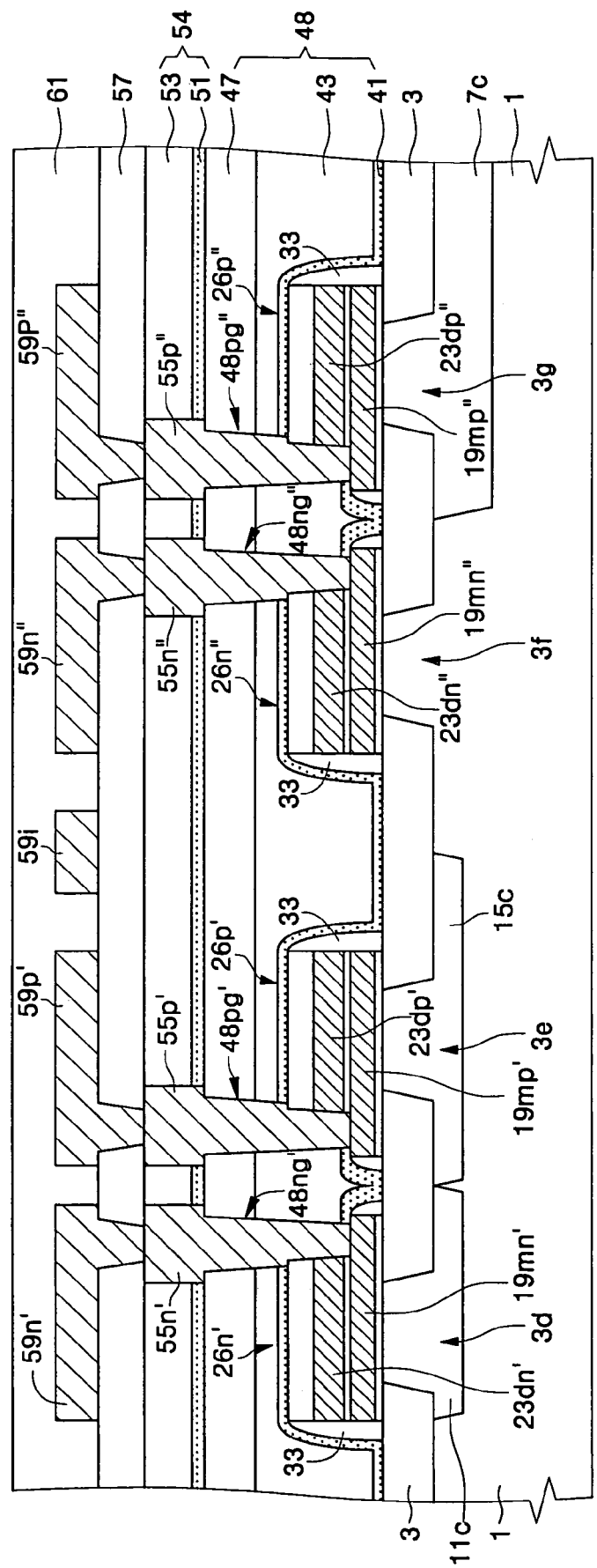

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view showing a semiconductor IC device according to some embodiments of the present invention. In FIG. 1, reference designators "A", "B" and "C" denote an SRAM cell region, a flash memory cell region and a logic circuit region, respectively. In addition, FIG. 2A to FIG. 12A are cross sectional views taken along line I-I' to illustrate semiconductor IC devices according to some embodiments of the present invention and fabrication methods thereof, FIG. 2B to FIG. 12B are cross sectional views taken along line II-II' to illustrate semiconductor IC devices according to some embodiments of the present invention and fabrication methods thereof, and FIG. 2C to FIG. 12C are cross sectional views taken along line III-III' to illustrate semiconductor IC devices according to some embodiments of the present invention and fabrication methods thereof.

First, methods of fabricating embedded semiconductor IC devices according to some embodiments of the present invention will be described.

Referring to FIG. 1, FIG. 2A, FIG. 2B and FIG. 2C, an isolation layer 3 is formed in a predetermined region of a semiconductor IC substrate 1 to define an SRAM cell active region, a flash memory cell active region and a logic transistor active region in the SRAM cell region A, the flash memory cell region B and the logic circuit region C, respectively. The SRAM cell active region may include access/driver transistor active region 3a and load transistor active region 3b which are spaced apart from each other, the flash memory cell active region may include a plurality of active regions 3c which are parallel to each other, and the logic transistor active region may include first to fourth logic transistor active regions 3d, 3e, 3f and 3g. The IC substrate 1 may be a P-type semiconductor substrate.

A first photoresist pattern 5 is formed on the substrate having the isolation layer 3. The first photoresist pattern 5 is formed to have openings that expose the SRAM cell region A, the flash memory cell region B and the fourth logic transistor active region 3g. N type impurity ions are implanted into the substrate 1 using the first photoresist pattern 5 as an ion implantation mask. As a result, first and second deep N wells 7a and 7b are formed in the substrate 1 of the SRAM cell region A and the substrate 1 of the flash memory cell region B, respectively, and a third deep N well 7c surrounding the fourth logic transistor active region 3g is formed in the substrate 1 of the logic circuit region C. The first deep N well 7a is formed to surround the access/driver transistor active region 3a and the load transistor active region 3b, and the second deep N well 7b is formed to surround the flash memory cell active regions 3c.

Referring to FIG. 1, FIG. 3A, FIG. 3B and FIG. 3C, the first photoresist pattern 5 is removed, and a second photoresist pattern 9 is formed on the substrate 1. The second photoresist pattern 9 is formed to have openings that expose the access/driver transistor active region 3a, the flash memory cell region B and the first logic transistor active region 3d. P type impurity ions are implanted into the substrate 1 using the second photoresist pattern 9 as an ion implantation mask, thereby forming first to third pocket P wells 11a, 11b and 11c in the first deep N well 7a, the second deep N well 7b and the substrate 1, respectively. As a result, the first pocket P well 11a is formed to surround the access/driver transistor active region 3a, the second pocket P well 11b is formed to surround the flash memory cell active regions 3c, and the third pocket P well 11c is formed to surround the first logic transistor active region 3d.

When flash memory cells to be formed in the flash memory cell region B are erased, a positive high erasure voltage is applied to the second pocket P well 11b. In this case, a reverse bias is applied between the second deep N well 7b and the P type substrate 1 to prevent the erasure voltage from being applied to the load transistor active region 3b as well as the logic transistor active regions 3d, 3e, 3f and 3g. In other words, the second deep N well 7b prevents electrical potentials of the load transistor active region 3b as well as the logic transistor active regions 3d, 3e, 3f and 3g from being altered due to the erasure voltage applied to the second pocket P well 11b.

Referring to FIG. 1, FIG. 4A, FIG. 4B and FIG. 4C, the second photoresist pattern 9 is removed, and third photoresist pattern 13 may be formed on the substrate 1. The third photoresist pattern 13 is formed to have openings that expose the load transistor active region 3b and the second logic transistor active region 3e. N type impurity ions are implanted into the substrate 1 using the third photoresist pattern 13 as an ion implantation mask, thereby forming a first shallow N well 15a surrounding the load transistor active region 3b and a second shallow N well 15c surrounding second logic transistor active region 3e.

In other embodiments of the present invention, the sequence of formation of the deep N wells 7a, 7b and 7c, the pocket P wells 11a, 11b and 11c, and the shallow N wells 15a and 15c can be changed. For example, an ion implantation process for forming the shallow N wells 15a and 15c may be performed after formation of the pocket P wells 11a, 11b and 11c.

In still other embodiments, the processes for forming the wells 7a, 7b, 7c, 11a, 11b, 11c, 15a and 15c may be performed prior to formation of the isolation layer 3.

Referring to FIG. 1, FIG. 5A, FIG. 5B and FIG. 5C, the third photoresist pattern 13 is removed. An SRAM gate insulating layer is then formed on the access/driver transistor active region 3a and the load transistor active region 3b, and a low-voltage gate insulating layer is formed on the first and second logic transistor active regions 3d and 3e. In addition, a tunnel insulating layer is formed on the flash memory cell active regions 3c, and a high-voltage gate insulating layer is formed on the third and fourth logic transistor active regions 3f and 3g. The tunnel insulating layer, the low-voltage gate insulating layer and the high-voltage gate insulating layer may have different thicknesses from each other.

A lower gate conductive layer is formed on the substrate having the tunnel insulating layer and the gate insulating layers, and the lower conductive layer is patterned to form openings (20 in FIG. 1) that expose the isolation layer 3 between the flash memory cell active regions 3c. An inter-gate insulating layer and an upper gate conductive layer are sequentially formed on the substrate having the openings 20. A capping insulating layer may be additionally formed on the upper gate conductive layer. The capping insulating layer, the upper gate conductive layer, the inter-gate insulating layer and the lower gate conductive layer are sequentially patterned to form SRAM cell gate patterns, flash memory cell gate patterns 26p and logic gate patterns that cross over the SRAM cell active region, the flash memory cell active region and the logic transistor active region, respectively. During formation of the gate patterns, the tunnel insulating layer and the gate insulating layers may be additionally etched to expose the active regions 3a, 3b, 3c, 3d, 3e, 3f and 3g. In addition, when the flash memory cell region B corresponds to NAND type flash memory cell region, a string selection gate pattern 26s and a ground selection gate pattern 26g crossing over the flash memory cell active regions 3c may be formed during formation of the gate patterns. The flash memory cell gate patterns 26p is formed between the string selection gate pattern 26s and the ground selection gate pattern 26g.

The SRAM cell gate patterns may include an access gate pattern 26a crossing over first and second portions of the access/driver transistor active region, a first common gate pattern 26c' crossing over the access/driver transistor active region 3a between the first and second portions as well as the load transistor active region 3b, and a second common gate pattern 26c" crossing over the access/driver transistor active region 3a between the first common gate pattern 26c' and the second portion as well as the load transistor active region 3b. The access gate pattern 26a may be formed to have a main access gate electrode 19ma and a dummy access gate electrode 23da which are sequentially stacked. In addition, the first common gate pattern 26c' may be formed to have a first main common gate electrode 19mc' and a first dummy common gate electrode 23dc' which are sequentially stacked, and the second common gate pattern 26c" may be formed to have a second main common gate electrode 19mc" and a second dummy common gate electrode 23dc" which are sequentially stacked. Further, each of the SRAM cell gate patterns 26a, 26c' and 26c" may further include an SRAM gate insulating layer pattern 17s interposed between the active regions 3a and 3b and the main gate electrodes 19ma, 19mc' and 19mc", an inter-gate insulating layer pattern 21 interposed between the main gate electrodes 19ma, 19mc' and 19mc" and the dummy gate electrodes 23da, 23dc' and 23dc", and a capping insulating layer pattern 25c on the dummy gate electrodes 23da, 23dc' and 23dc".

Each of the flash memory cell gate patterns 26p is formed to have a control gate electrode 23c crossing over the flash memory cell active regions 3c as well as floating gates 19f interposed between the control gate electrode 23c and the flash memory cell active region 3c. In addition, each of the flash memory cell gate patterns 26p may further include a tunnel insulating layer pattern 17t between the floating gates 19f and the flash memory cell active regions 3c as well as an inter-gate insulating layer pattern 21 between the floating gates 19f and the control gate electrode 23c, and a capping insulating layer pattern 25c on the control gate electrode 23c.

The string selection gate pattern 26s may be formed to have a main string selection gate electrode 19ms and a dummy string selection gate electrode 23ds which are sequentially stacked, and the ground selection gate pattern 26g may be formed to have a main ground selection gate electrode 19mg and a dummy ground selection gate electrode 23dg which are sequentially stacked. The selection gate patterns 26s and 26g may also further include a tunnel insulating layer patterns 17t between the main selection gate electrodes 19ms and 19mg and the flash memory cell active regions 3c, an inter-gate insulating layer patterns 21 between the main selection gate electrodes 19ms and 19mg and the dummy selection gate electrodes 23ds and 23dg, and a capping insulating layer patterns 25c on the dummy selection gate electrodes 23ds and 23dg. The logic gate patterns may include a first NMOS gate pattern 26n', a first PMOS gate pattern 26p', a second NMOS gate pattern 26n", and a second PMOS gate pattern 26p" which cross over the first to fourth logic transistor active regions 3d, 3e, 3f and 3g, respectively. The first NMOS gate pattern 26n' is formed to have a first main NMOS gate electrode 19nm' and a first dummy NMOS gate electrode 23dn' which are sequentially stacked, and the first PMOS gate pattern 26p' is formed to have a first main PMOS gate electrode 19mp' and a first dummy PMOS gate electrode 23dp' which are sequentially stacked. In addition, the second NMOS gate pattern 26n" is formed to have a second main NMOS gate electrode 19nm" and a second dummy NMOS gate electrode 23dn" which are sequentially stacked, and the second PMOS gate pattern 26p" is formed to have a second main PMOS gate electrode 19mp" and a second dummy PMOS gate electrode 23dp" which are sequentially stacked.

Moreover, the first gate patterns 26n' and 26p' may further include low-voltage gate insulating layer patterns 17' between the first main gate electrodes 19nm' and 19mp' and the first and second logic transistor active regions 3d and 3e, gate interlayer insulating layer patterns 21 between the first main gate electrodes 19nm' and 19mp' and the first dummy gate electrodes 23dn' and 23dp', and capping insulating layer patterns 25c on the first dummy gate electrodes 23dn' and 23dp'. Similarly, the second gate patterns 26n" and 26p" may further include high-voltage gate insulating layer patterns 17" between the second main gate electrodes 19nm" and 19mp" and the third and fourth logic transistor active regions 3f and 3g, gate interlayer insulating layer patterns 21 between the second main gate electrodes 19nm" and 19mp" and the second dummy gate electrodes 23dn" and 23dp", and capping insulating layer patterns 25c on the second dummy gate electrodes 23dn" and 23dp". The high-voltage gate insulating layer patterns 17" may be thicker than the low-voltage gate insulating layer 17'.

Referring to FIG. 1, FIG. 6A, FIG. 6B and FIG. 6C, impurity regions such as N type source/drain regions and P type source/drain regions are formed in the active regions 3a, 3b, 3c, 3d, 3e, 3f and 3g adjacent to the gate patterns 26a', 26c', 26c", 26s, 26p, 26g, 26n', 26p', 26n" and 26p" using a typical method well known in the art. The impurity regions may be formed to have lightly-doped drain (LDD) regions. In this case, spacers 33 may be formed on sidewalls of the gate patterns 26a', 26c', 26c", 26s, 26p, 26g, 26n', 26p', 26n" and 26p". In other words, N type high-concentration impurity regions 35 may be formed in the pocket P well regions 11a, 11b and 11c, and N type low-concentration impurity regions 29 extending from the N type high-concentration impurity regions 35 may be formed in the pocket P well regions 11a, 11b and 11c below the spacers 33. Similarly, P type high-concentration impurity regions 37 may be formed in the shallow N wells 15a and 15c, and P type low-concentration impurity regions 31 extending from the P type high-concentration impurity regions 37 may be formed in the shallow N wells 15a and 15c below the spacers 33.

Other N type impurity regions (not shown) deeper than the N type impurity regions 29 and 35 may be formed in the third logic transistor active region 3f, and other P type impurity regions (not shown) deeper than the P type impurity regions 31 and 37 may be formed in the fourth logic transistor active region 3g.

As a result, first and second access transistors are respectively formed at intersections of the access gate pattern 26a and the access/driver transistor active region 3a, first and second driver transistors are respectively formed at intersections of the first and second common gate patterns 26c' and 26c" and the access/driver transistor active region 3a, and first and second load transistors are respectively formed at intersections of the first and second common gate patterns 26c' and 26c" and the load transistor active region 3b. In addition, flash memory cells are formed at intersections of the flash memory cell gate patterns 26p and the flash memory cell active regions 3c, string selection transistors are formed at intersections of the string selection gate pattern 26s and the flash memory cell active regions 3c, and ground selection transistors are formed at intersections of the ground selection gate pattern 26g and the flash memory cell active regions 3c. Further, a low-voltage NMOS transistor is formed at an intersection of the first NMOS gate pattern 26n' and the first logic transistor active region 3d, and a low-voltage PMOS transistor is formed at an intersection of the first PMOS gate pattern 26p' and the second logic transistor active region 3e. Similarly, a high-voltage NMOS transistor is formed at an intersection of the second NMOS gate pattern 26n" and the third logic transistor active region 3f, and a high-voltage PMOS transistor is formed at an intersection of the second PMOS gate pattern 26p" and the fourth logic transistor active region 3g. The high-voltage NMOS transistor may be formed to have characteristics of an enhancement type MOS transistor or a depletion type MOS transistor by applying a proper channel ion implantation process to the third logic transistor active region 3f.

Referring to FIG. 1, FIG. 7A, FIG. 7B and FIG. 7C, the capping insulating layer patterns 25c, the first and second dummy common gate electrodes 23dc' and 23dc", and the inter-gate insulating layer patterns 21 are etched to form first and second node butting contact regions 39n' and 39n" that expose a portion of the first main common gate electrode 19mc' and a portion of the second main common gate electrode 19mc" respectively. During formation of the node butting contact regions 39n' and 39n", additional butting contact regions 39g may be formed to expose a portion of the main access gate electrode 19ma, a portion of the main string selection gate electrode 19ms, a portion of the main ground selection gate electrode 19mg, a portion of the first main NMOS gate electrode 19nm', a portion of the first main PMOS gate electrode 19mp', a portion of the second main NMOS gate electrode 19nm", and a portion of the second main PMOS gate electrode 19mp".

Referring to FIG. 1, FIG. 8A, FIG. 8B and FIG. 8C, a first lower interlayer insulating layer 43 is formed on the substrate where the butting contact regions 39n', 39n" and 39g are formed. A lower etch stop layer 41 having an etch selectivity with respect to the first lower interlayer insulating layer 43 may be additionally formed prior to formation of the first lower interlayer insulating layer 43. The first lower interlayer insulating layer 43 and the lower etch stop layer 41 are patterned to form a slit-shaped common source line contact hole that exposes the N type high-concentration impurity regions in the flash memory cell active regions 3c which is adjacent to the ground selection gate pattern 26g and located opposite the string selection gate pattern 26s. A common source line 45cs is then formed to fill the common source line contact hole.

A second lower interlayer insulating layer 47 is formed on the substrate having the common source line 45cs. The lower etch stop layer 41 and the first and second lower interlayer insulating layers 43 and 47 constitute a lower interlayer insulating layer 48. In the event that the first and second lower interlayer insulating layers 43 and 47 are formed of an insulating layer such as a silicon oxide layer, the lower etch stop layer 41 may be formed of a silicon oxynitride layer or a silicon nitride layer.

Referring to FIG. 1, FIG. 9A, FIG. 9B and FIG. 9C, the lower interlayer insulating layer 48 is patterned to form bit line contact holes 47b that expose the flash memory cell active regions 3c which are adjacent to the string selection gate pattern 26s and located opposite the ground selection gate pattern 26g. Bit line contact plugs 49b are then formed to fill the bit line contact holes 47b. The bit line contact plugs 49b may be formed of a doped polysiliccon layer. An insulating layer 53 is formed on the substrate having the bit line contact plugs 49b. An upper etch stop layer 51 having an etch selectivity with respect to the insulating layer 53 may be formed prior to formation of the insulating layer 53. In the event that the insulating layer 53 is formed of a silicon oxide layer, the upper etch stop layer 51 may be formed of a silicon oxynitride layer or a silicon nitride layer. The upper etch stop layer 51 and the insulating layer 53 constitute a molding layer 54.

Referring to FIG. 1, FIG. 10A, FIG. 10B and FIG. 10C, the molding layer 54 is patterned to form a plurality of grooves in the SRAM cell region A, the flash memory cell region B and the logic circuit region C. In particular, the grooves in the flash memory cell region B may be formed to expose the bit line contact plugs 49b and to cross over the flash memory cell gate patterns 26p and the selection gate patterns 26s and 26g.

Subsequently, predetermined regions of the lower interlayer insulating layer 48 exposed by the grooves are selectively etched to form first and second lower bit line contact holes 48b' and 48b", first to sixth node contact holes 48na, 48pa, 48nb, 48pb, 48n' and 48n", an SRAM cell ground line contact hole 48s, an SRAM cell power supply line contact hole 48c, and a word line contact hole 48w, a string selection gate interconnection contact hole 48ss, control gate interconnection contact holes 48p, a ground selection gate interconnection contact hole 48gs, and an upper common source line contact hole 48cs, and the first to fourth logic gate interconnection contact holes 48ng', 48pg', 48ng" and 48pg". The first and second lower bit line contact holes 48b' and 48b" are formed to expose the N type high-concentration impurity regions 35 at both ends of the access/driver transistor active region 3a adjacent to the access gate pattern 26a respectively, the SRAM cell ground line contact hole 48s is formed to expose the N type high-concentration impurity region 35 in the access/driver transistor active region 3a between the first and second common gate patterns 26c' and 26c", and the SRAM cell power supply line contact hole 48c is formed to expose the P type high-concentration impurity region 37 in the load transistor active region 3b between the first and second common gate patterns 26c' and 26c". In addition, the first and second node contact holes 48na and 48pa are form to expose the N type high-concentration impurity region 35 in the access/driver transistor active region 3a which is adjacent to the first common gate pattern 26c' and located opposite the ground line contact hole 48s as well as the P type high-concentration impurity region 37 in the load transistor active region 3b which is adjacent to the first common gate pattern 26c' and located opposite the power supply line contact hole 48c, respectively. Similarly, the third and fourth node contact holes 48nb and 48pb are formed to expose the N type high-concentration impurity region 35 in the access/driver transistor active region 3a which is adjacent to the second common gate pattern 26c" and located opposite the ground line contact hole 48s as well as the P type high-concentration impurity region 37 in the load transistor active region 3b which is adjacent to the second common gate pattern 26c" and located opposite the power supply line contact hole 48c, respectively. In addition, the fifth and sixth node contact holes 48n' and 48n" are formed to expose the first and second main common gate electrodes 19mc' and 19mc" through the first and second node butting contact regions 39n' and 39n", respectively. Moreover, the word line contact hole 48w is formed to expose the main access gate electrode 19ma.

The string selection gate interconnection contact hole 48ss is formed to expose the main string selection gate electrode 19ms, and the ground selection gate interconnection contact hole 48gs is formed to expose the main ground selection gate electrode 19mg. In addition, the control gate interconnection contact holes 48p is formed to expose the control gate electrodes 23c, and the upper common source line contact hole 48cs is formed to expose the common source line 45cs. In the event that a process for forming the flash memory bit line contact plug 49b is omitted, the flash memory bit line contact holes 47b may be formed during formation of the contact holes 48ss, 48gs, 48p and 48cs.

The first to fourth logic gate interconnection contact holes 48ng', 48pg', 48ng" and 48pg" are formed to expose the first main NMOS gate electrode 19nm', the first main PMOS gate electrode 19mp', the second main NMOS gate electrode 19nm" and the second main PMOS gate electrode 19mp", respectively.

Subsequently, a conductive layer such as a tungsten layer is formed on the substrate having the grooves and the contact holes. The conductive layer is then planarized until the molding layer 54 is exposed. As a result, SRAM cell local interconnections are formed in the SRAM cell region A, and flash memory bit lines 55b, a string selection gate interconnection 55ss, a ground selection gate interconnection 55gs, control gate interconnections 55p and an upper common source line 55cs are formed in the flash memory cell region B. Also, logic gate interconnections are formed in the logic circuit region C during formation of the SRAM cell local interconnections.

The SRAM cell local interconnections may include first and second bit line contact pads 55b' and 55b" electrically connected to the N type high-concentration impurity regions 35 though the first and second lower bit line contact holes 48b' and 48b", a first node interconnection 55i' for electrically connecting the first node impurity regions 35 and 37 adjacent to the first common gate pattern 26c' to the second main common gate electrode 19mc" through the first, second and sixth node contact holes 48na, 48pa and 48n", and a second node interconnection 55i" for electrically connecting the second node impurity regions 35 and 37 adjacent to the second common gate pattern 26c" to the first main common gate electrode 19mc' through the third, fourth and fifth node contact holes 48nb, 48pb and 48n'. In addition, the SRAM cell local interconnections may include a ground line 55s electrically connected to the access/driver transistor active region 3a between the first and second common gate patterns 26c' and 26c" through the SRAM cell ground line contact hole 48s, a power supply line 55c electrically connected to the load transistor active region 3b between the first and second common gate patterns 26c' and 26c" through the SRAM cell power supply line contact hole 48c, and a word line interconnection 55w electrically connected to the main access gate electrode 19ma through the word line contact hole 48w. The power supply line 55c and ground line 55s may be formed parallel to the access gate pattern 26a.

The flash memory bit lines 55b are formed to contact the bit line contact plugs 49b, the string selection gate interconnection 48ss is formed to contact the main string selection gate electrode 19ms, and the ground selection gate interconnection 48gs is formed to contact the main ground selection gate electrode 19mg. In addition, the control gate interconnections 55p are formed to contact the control gate electrodes 23c respectively, and the upper common source line 55cs is formed to contact the common source line 45cs through the upper common source line contact hole 48cs.

The logic gate interconnections may include first to fourth logic gate interconnections 55ng', 55pg', 55ng" and 55pg" electrically connected to the first main NMOS gate electrode 19nm', the first main PMOS gate electrode 19mp', the second main NMOS gate electrode 19nm" and the second main PMOS gate electrode 19mp" through the first to fourth logic gate interconnection contact holes 48ng', 48pg', 48ng" and 48pg", respectively. The first to fourth logic gate interconnections 55ng', 55pg', 55ng" and 55pg" may be formed to have a pad configuration.

An intermediate interlayer insulating layer 57 is formed on the substrate having the SRAM cell local interconnections, the flash memory bit lines 55b and the logic gate interconnections 55ng', 55pg', 55ng" and 55pg".

Referring to FIG. 1, FIG. 11A, FIG. 11B and FIG. 11C, the intermediate interlayer insulating layer 57 is patterned to form bit line contact holes 57b' and 57b" that expose the first and second bit line contact pads 55b' and 55b", respectively. During formation of the upper bit line contact holes 57b' and 57b", additional contact holes may be formed to expose the SRAM cell power supply line 55c, the SRAM cell ground line 55s, the upper common source line 55cs and the first to fourth logic gate interconnections 55ng', 55pg', 55ng" and 55pg".

A conductive layer such as a metal layer is formed on the substrate having the upper bit line contact holes 57b' and 57b". The conductive layer is patterned to form first and second SRAM cell bit lines 59b' and 59b" which are electrically connected to the first and second bit line contact pads 55b' and 55b", respectively. The SRAM cell bit lines 59b' and 59b" may be formed to cross over the access gate pattern 26a. During formation of the SRAM cell bit lines 59b' and 59b", an upper power supply line 59c, an upper ground line 59s, a flash memory cell ground line 59cs and first to fourth upper logic gate interconnections 59n', 59p', 59n" and 59p" may be additionally formed. The upper power supply line 59c, the upper ground line 59s and the flash memory cell ground line 59cs are electrically connected to the SRAM cell power supply line 55c, the SRAM cell ground line 55s and the upper common source line 55cs, respectively. Furthermore, the first to fourth upper logic gate interconnections 59n', 59p', 59n" and 59p" are electrically connected to the first to fourth logic gate interconnections 55ng', 55pg', 55ng" and 55pg", respectively. In addition, during formation of the SRAM cell bit lines 59b' and 59b", logic signal lines 59i may be additionally formed on the intermediate interlayer insulating layer 57 of the logic circuit region C. An upper interlayer insulating layer 61 is formed on the substrate having the SRAM cell bit lines 59b' and 59b".

Figure 12A:
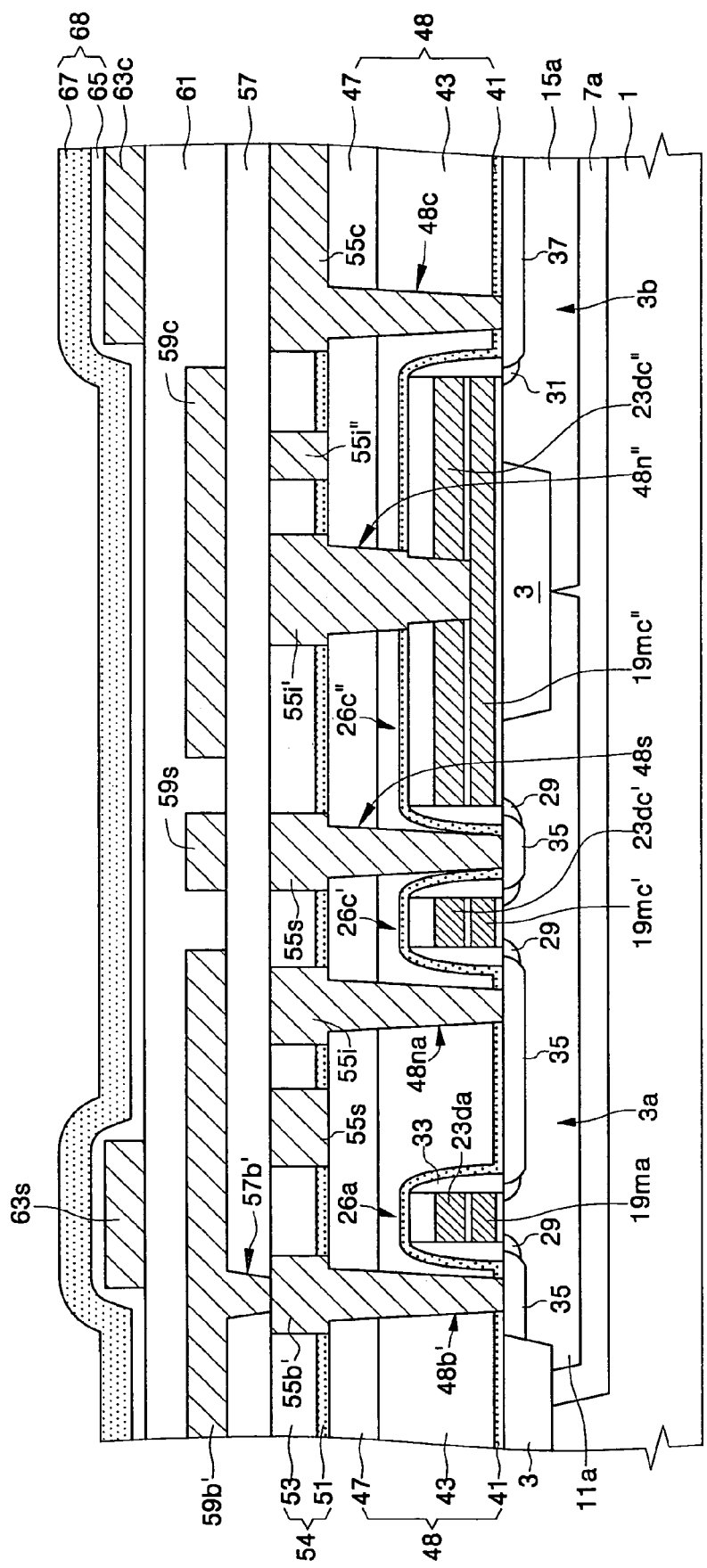
Figure 12B:
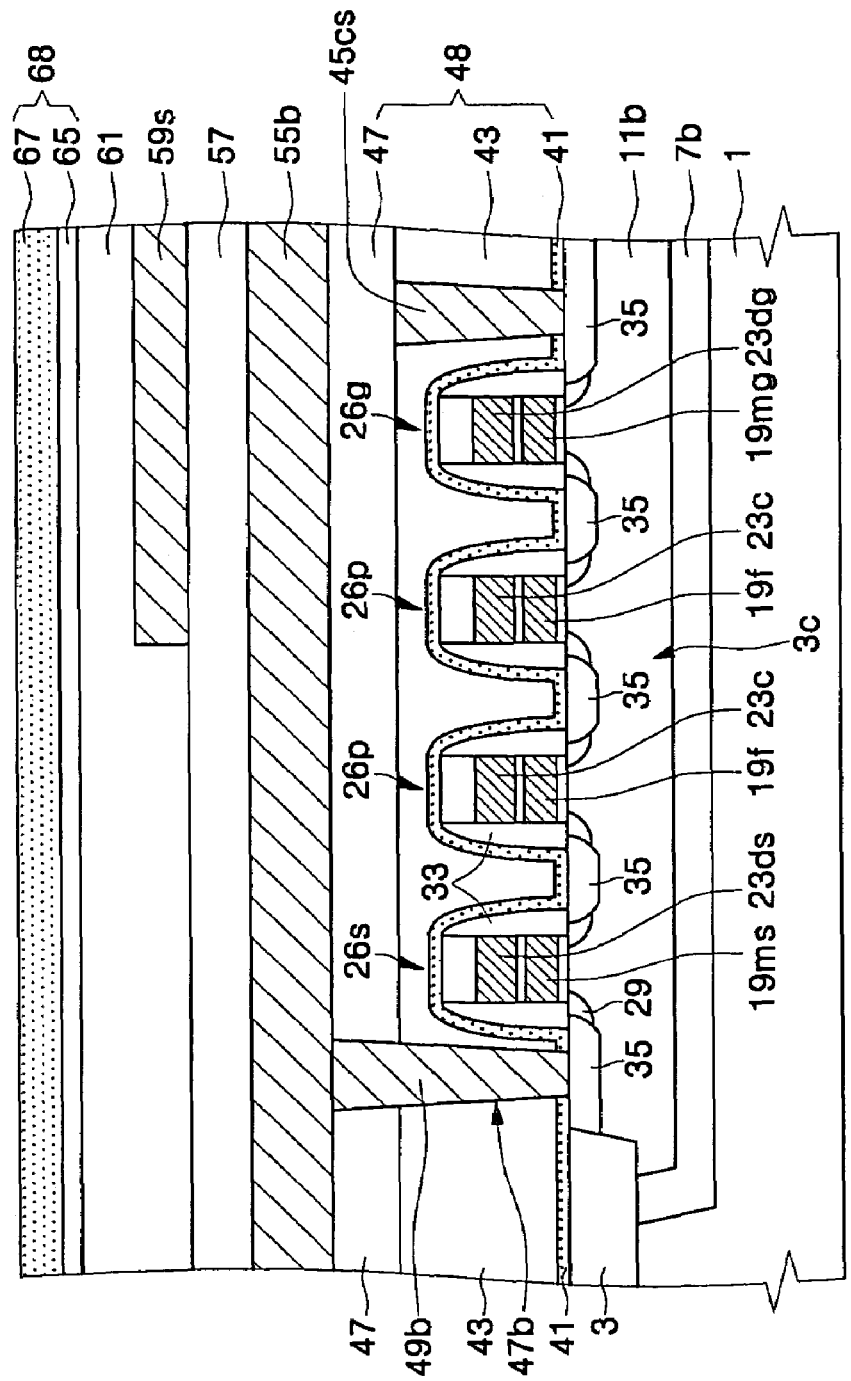
Figure 12C:
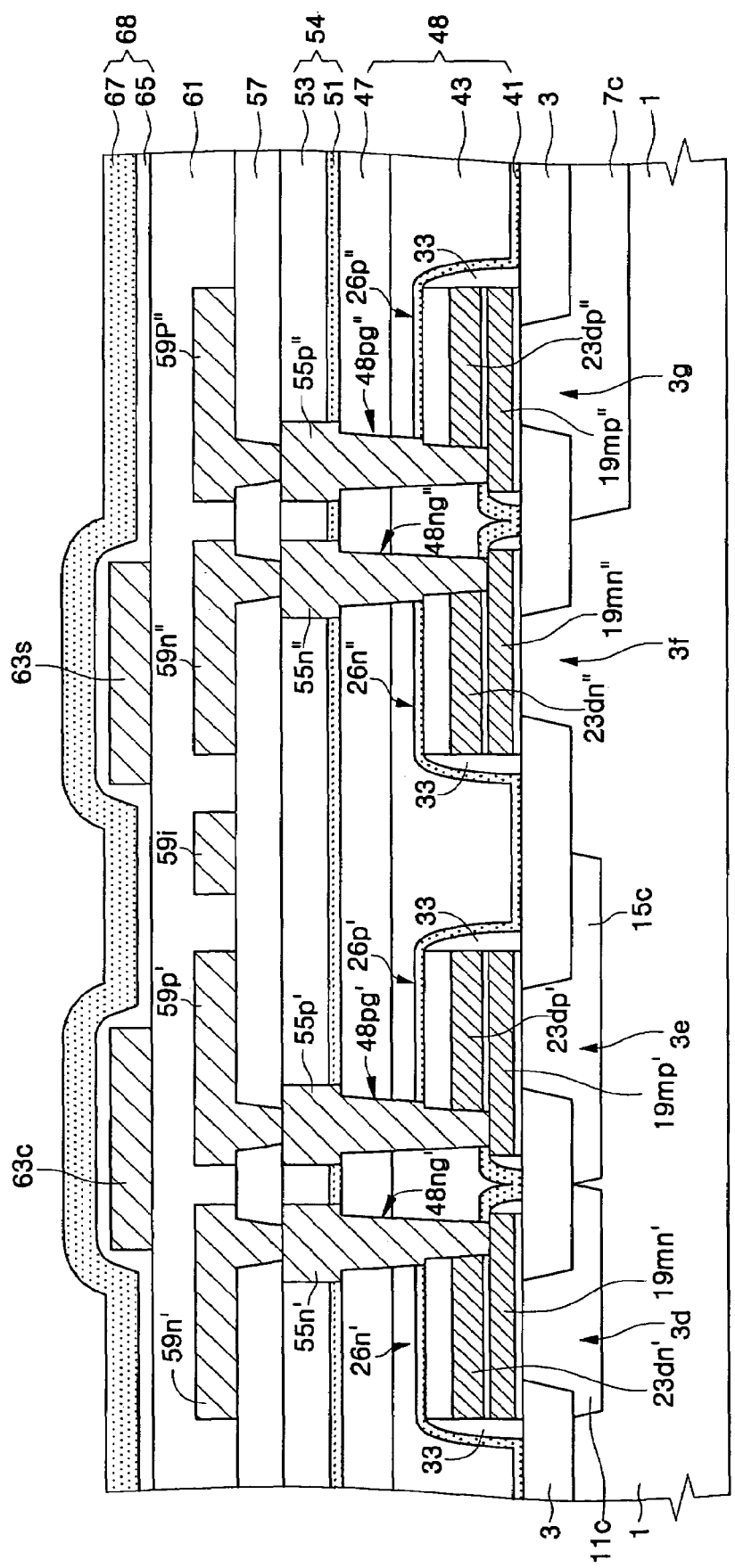

Referring to FIG. 12A, FIG. 12B and FIG. 12C, power supply lines 63s and 63c and metal pads (not shown) are formed on the upper interlayer insulating layer 61, and a passivation layer 68 is formed on the substrate having the power supply lines 63s and 63c and metal pads. The passivation layer 68 may be formed by sequentially stacking a lower passivation layer 65 and an upper passivation layer 67. The lower passivation layer 65 may be formed of a silicon oxide layer, and the upper passivation layer 67 may be formed of a silicon nitride layer.

According to the embodiments of the present invention as described above, it is possible to form SRAM cells and logic transistors as well as flash memory cells using a process for forming the flash memory cells having the stacked gate structure. Therefore, efficiency of processes for manufacturing embedded semiconductor IC devices having at least two different type memory cells may be improved.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor integrated circuit device, comprising:
   providing an integrated circuit substrate having an SRAM cell region, a flash memory cell region, and a logic circuit region;
   forming an isolation layer in a predetermined region of the substrate to define an SRAM cell active region, a flash memory cell active region and a logic transistor active region in the SRAM cell region, the flash memory cell region and the logic circuit region, respectively; and
   forming an SRAM cell gate pattern, a flash memory cell gate pattern and a logic gate pattern crossing over the SRAM cell active region, the flash memory cell active region and the logic transistor active region, respectively,
   wherein the SRAM cell gate pattern is formed to have a main SRAM cell gate electrode and a dummy SRAM cell gate electrode which are sequentially stacked, the flash memory cell gate pattern is formed to have a control gate electrode crossing over the flash memory cell active region as well as a floating gate interposed between the control gate electrode and the flash memory cell active region, and the logic gate pattern is formed to have a main logic gate electrode and a dummy logic gate electrode which are sequentially stacked, and
   wherein the main SRAM cell gate electrode and the main logic gate electrode are formed from a same material layer as the floating gate, and the dummy SRAM cell gate electrode and the dummy logic gate electrode are formed from a same material layer as the control gate electrode.

2. The method according to claim 1, wherein a string selection gate pattern and a ground selection gate pattern are formed to cross over the flash memory cell active region and to be disposed at both sides of the flash memory cell gate pattern respectively, during formation of the gate patterns,
   wherein the string selection gate pattern is formed to have a main string selection gate electrode and a dummy string selection gate electrode which are sequentially stacked, and the ground selection gate pattern is formed to have a main ground selection gate electrode and a dummy ground selection gate electrode which are sequentially stacked.

3. The method according to claim 2, wherein forming the gate patterns comprising:
   forming gate insulating layers on the SRAM cell active region and the logic transistor active region as well as a tunneling insulating layer on the flash memory cell active region;
   sequentially forming a lower gate conductive layer, an inter-gate insulating layer and an upper gate conductive layer on the substrate having the gate insulating layers and the tunneling insulating layer; and
   patterning the upper gate conductive layer, the inter-gate insulating layer, the lower gate conductive layer, the gate insulating layers and the tunneling insulating layer.

4. The method according to claim 3, further comprising etching a portion of the dummy SRAM cell gate electrode, a portion of the dummy string selection gate electrode, a portion of the dummy ground selection gate electrode, a portion of the dummy logic gate electrode and the inter-gate insulating layer to form butting contact regions that expose the main SRAM cell gate electrode, the main string selection gate electrode, the main ground selection gate electrode and the main logic gate electrode.

5. The method according to claim 4, further comprising sequentially forming a lower interlayer insulating layer and a molding layer on the substrate having the butting contact regions.

6. The method according to claim 5, further comprising forming an SRAM cell local interconnection, a flash memory bit line, a string selection gate interconnection, a ground selection gate interconnection and a logic gate interconnection in the molding layer, wherein the SRAM cell local interconnection, the string selection gate interconnection, the ground selection gate interconnection and the logic gate interconnection are electrically connected to the main SRAM cell gate electrode, the main string selection gate electrode, the main ground selection gate electrode and the main logic gate electrode through the butting contact regions, respectively, and the flash memory bit line is electrically connected to the flash memory cell active region.

7. The method according to claim 5, further comprising forming an intermediate interlayer insulating layer on the molding layer.

8. The method according to claim 7, further comprising forming an SRAM cell bit line, a flash memory cell ground line and a logic signal line on the intermediate interlayer insulating layer,
wherein the SRAM cell bit line is electrically connected to the SRAM cell active region, the flash memory cell ground line is electrically connected to the flash memory cell active region which is adjacent to the ground selection gate pattern and located opposite the string selection gate pattern, and the logic signal line is electrically connected to the main logic gate electrode.

9. A method of fabricating a semiconductor integrated circuit device, comprising:
providing an integrated circuit substrate having an SRALN/1 cell region, a flash memory cell region and a logic circuit region;
forming an isolation layer in a predetermined region of the substrate to define an access/driver transistor active region and an load transistor active region in the SRAM cell region, a flash memory cell active region in the flash memory cell region, and first to fourth logic transistor active regions in the logic circuit region; and
forming an access gate pattern crossing over first and second portions of the access/driver transistor active region, a first common gate pattern crossing over the access/driver transistor active region between the first and second portions as well as the load transistor active region, a second common gate pattern crossing over the access/driver transistor active region between the first common gate pattern and the second portion as well as the load transistor active region, a flash memory cell gate pattern including a control gate electrode crossing over the flash memory cell active region as well as a floating gate interposed between the control gate electrode and the flash memory cell active region, a first NMOS gate pattern crossing over the first logic transistor active region, a first PMOS gate pattern crossing over the second logic transistor active region, a second NMOS gate pattern crossing over the third logic transistor active region and a second PMOS gate pattern crossing over the fourth logic transistor active region,
wherein the access gate pattern is formed to have a main access gate electrode and a dummy access gate electrode which are sequentially stacked,
wherein the first common gate pattern is formed to have a first main common gate electrode and a first dummy common gate electrode which are sequentially stacked,
wherein the second common gate pattern is formed to have a second main common gate electrode and a second dummy common gate electrode which are sequentially stacked,
wherein the first NMOS gate pattern is formed to have a first main NMOS gate electrode and a first dummy NMOS gate electrode which are sequentially stacked,
wherein the first PMOS gate pattern is formed to have a first main PMOS gate electrode and a first dummy PMOS gate electrode which are sequentially stacked,
wherein the second NMOS gate pattern is formed to have a second main NMOS gate electrode and a second dummy NMOS gate electrode which are sequentially stacked,
wherein the second PMOS gate pattern is formed to have a second main PMOS gate electrode and a second dummy PMOS gate electrode which are sequentially stacked,
wherein the main access gate electrode, the first main common gate electrode, the second main common gate electrode, the first main NMOS gate electrode, the first main PMOS gate electrode, the second main NMOS gate electrode, and the second main PMOS gate electrode are formed of the same material layer as the floating gate; and
wherein the dummy access gate electrode, the first dummy common gate electrode, the second dummy common gate electrode, the first dummy NMOS gate electrode, the first dummy PMOS gate electrode, the second dummy NMOS gate electrode, and the second dummy PMOS gate electrode are formed of the same material layer as the control gate electrode.

10. The method according to claim 9, further comprising:
forming first to third deep N wells in the substrate of the SRAM cell region, the substrate of the flash memory cell region and a first portion of the substrate of the logic circuit region, respectively;
forming first to third pocket P wells in the first deep N well, the second deep N well and a second portion of the substrate of the logic circuit region, respectively; and
forming a first shallow N well in the first deep N well and a second shallow N well in a third portion of the substrate of the logic circuit region,
wherein the first to third pocket P wells are formed to surround the access/driver transistor active region, the flash memory cell active region and the first logic transistor active region, respectively,
wherein the first and second shallow N wells are formed to surround the load transistor active region and the second logic transistor active region, respectively, and
wherein the third deep N well is formed to surround the fourth logic transistor active region.

11. The method according to claim 10, wherein the first to third deep N wells, the first to third pocket P wells, and the first and second shallow N wells are formed prior to formation of the isolation layer.

12. The method according to claim 10, wherein the first to third deep N wells, the first to third pocket P wells, and the first and second shallow N wells are formed after formation of the isolation layer.

13. The method according to claim 9, wherein a string selection gate pattern and a ground selection gate pattern are formed to cross over the flash memory cell active region and to be disposed at both sides of the flash memory cell gate pattern respectively, during formation of the gate patterns, wherein the string selection gate pattern is formed to have a main string selection gate electrode and a dummy string selection gate electrode which are sequentially stacked, and wherein the ground selection gate pattern is formed to have a main ground selection gate electrode and a dummy ground selection gate electrode which are sequentially stacked.

14. The method according to claim 13, wherein forming the gate patterns comprises:

forming gate insulating layers on the SRAM cell active region and the logic transistor active region as well as a tunneling insulating layer on the flash memory cell active region;

sequentially forming a lower gate conductive layer, an inter-gate insulating layer and an upper gate conductive layer on the substrate having the gate insulating layers and the tunneling insulating layer; and patterning the upper gate conductive layer, the inter-gate insulating layer, the lower gate conductive layer, the gate insulating layers and the tunneling insulating layer.

15. The method according to claim 14, further comprising patterning the first and second dummy common gate electrodes, the dummy string selection gate electrode, the dummy ground selection gate electrode, the first dummy NMOS gate electrode, the first dummy PMOS gate electrode, the second dummy NMOS gate electrode, the second PMOS gate electrode and the inter-gate insulating layer to form butting contact regions that expose the first main common gate electrode, the second main common gate electrode, the main string selection gate electrode, the main ground selection gate electrode, the first main NMOS gate electrode, the first main PMOS gate electrode, the second main NMOS gate electrode and the second main PMOS gate electrode.

16. The method according to claim 15, further comprising sequentially forming a lower interlayer insulating layer and a molding layer on the substrate having the buffing contact regions.

17. The method according to claim 16, further comprising forming a first node interconnection, a second node interconnection, a flash memory bit line, a string selection gate interconnection, a ground selection gate interconnection, a first NMOS gate interconnection, a first PMOS gate interconnection, a second NMOS gate interconnection and a second PMOS gate interconnection in the molding layer, wherein the first node interconnection is electrically connected the access/driver transistor active region between the access gate pattern and the first common gate pattern, the load transistor active region which is adjacent to the first common gate pattern and located opposite the second common gate pattern, and the second main common gate electrode, wherein the second node interconnection is electrically connected the access/driver transistor active region between the access gate pattern and the second common gate pattern, the load transistor active region which is adjacent to the second common gate pattern and located opposite the first common gate pattern, and the first main common gate electrode, wherein the flash memory bit line is electrically connected to the flash memory cell active region which is adjacent to the string selection gate pattern and located opposite the ground selection gate pattern, wherein the string selection gate interconnection is electrically connected to the main string selection gate electrode, wherein the ground selection gate interconnection is electrically connected to the main ground selection gate electrode, wherein the first NMOS gate interconnection is electrically connected to the first main NMOS gate electrode, wherein the first PMOS gate electrode is electrically connected to the first main PMOS gate electrode, wherein the second NMOS gate interconnection is electrically connected to the second main NMOS gate electrode, and wherein the second PMOS gate interconnection is electrically connected to second PMOS gate electrode.

18. The method according to claim 16, further comprising forming an intermediate interlayer insulating layer on the molding layer.

19. The method according to claim 18, further comprising forming first and second SRAM cell bit lines, a flash memory cell ground line and first to fourth logic signal lines on the intermediate interlayer insulating layer, wherein the first and second SRAM cell bit lines are electrically connected to both ends of the access/driver transistor active region adjacent to the access gate pattern, respectively, wherein the flash memory cell ground line is electrically connected to the flash memory cell active region which is adjacent to the ground selection gate pattern and located opposite the string selection gate pattern, and wherein the first to fourth logic signal lines are electrically connected to the first main NMOS gate electrode, the first main PMOS gate electrode, the second main NMOS gate electrode and the second main PMOS gate electrode, respectively.

* * * * *

UNITED STATES PATENT AND TRADEMARK OFFICE
CERTIFICATE OF CORRECTION

PATENT NO. : 7,482,224 B2 Page 1 of 1
APPLICATION NO. : 11/301763
DATED : January 27, 2009
INVENTOR(S) : Kim et al.

It is certified that error appears in the above-identified patent and that said Letters Patent is hereby corrected as shown below:

Column 10, Line 64: New paragraph should start with "The logic gate patterns"

Column 13, Line 29: New paragraph should start with "The first"

Column 17, Claim 9, Line 38: Please correct "SRALN/1" to read -- SRAM --

Column 19, Claim 16, Line 38: Please correct "buffing" to read -- butting --

Signed and Sealed this

Twenty-fourth Day of March, 2009

JOHN DOLL
*Acting Director of the United States Patent and Trademark Office*